(12) United States Patent
Tamiya

(10) Patent No.: US 7,694,260 B2
(45) Date of Patent: Apr. 6, 2010

(54) SEMICONDUCTOR INTEGRATED CIRCUIT, LAYOUT METHOD, LAYOUT APPARATUS AND LAYOUT PROGRAM

(75) Inventor: Masayuki Tamiya, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 105 days.

(21) Appl. No.: 11/328,075

(22) Filed: Jan. 10, 2006

(65) Prior Publication Data

US 2006/0157739 A1   Jul. 20, 2006

(30) Foreign Application Priority Data

Jan. 18, 2005   (JP)   ............................. 2005-010214

(51) Int. Cl.
*G06F 17/50* (2006.01)
*H01L 23/52* (2006.01)

(52) U.S. Cl. .................. 716/12; 257/208; 257/774; 438/667

(58) Field of Classification Search .......... 716/7, 716/9, 12, 19–21, 1; 257/208; 700/90–121; 438/14–18; 430/5, 30; 382/141–152; 702/108–126
See application file for complete search history.

(56) References Cited

U.S. PATENT DOCUMENTS

| | | | | |
|---|---|---|---|---|
| 5,157,618 A * | 10/1992 | Ravindra et al. | .............. | 716/16 |
| 5,378,927 A * | 1/1995 | McAllister et al. | ........... | 257/773 |
| 5,585,675 A * | 12/1996 | Knopf | .................. | 257/774 |
| 5,754,826 A * | 5/1998 | Gamal et al. | .................. | 703/14 |
| 6,141,025 A | 10/2000 | Oka et al. | | |
| 6,230,304 B1 * | 5/2001 | Groeneveld et al. | ............ | 716/7 |
| 6,391,669 B1 * | 5/2002 | Fasano et al. | ................. | 438/18 |
| 6,737,748 B2 * | 5/2004 | Bauch et al. | ................. | 257/763 |
| 6,756,242 B1 * | 6/2004 | Regan | ........................ | 438/14 |
| 6,765,296 B2 * | 7/2004 | Park et al. | .................... | 257/758 |
| 6,826,742 B2 * | 11/2004 | Maeno et al. | ................. | 716/12 |
| 6,943,446 B2 * | 9/2005 | McCormick et al. | ........ | 257/728 |
| 7,007,258 B2 * | 2/2006 | Li | ................................ | 716/9 |
| 7,088,000 B2 * | 8/2006 | Cranmer et al. | ............. | 257/767 |
| 7,126,381 B1 * | 10/2006 | Schmit et al. | ............... | 326/101 |

(Continued)

FOREIGN PATENT DOCUMENTS

JP   2002-24313   1/2002

*Primary Examiner*—Jack Chiang
*Assistant Examiner*—Patrick Sandoval
(74) *Attorney, Agent, or Firm*—McGinn Intellectual Property Law Group, PLLC

(57) ABSTRACT

An intermediate wiring layer, lowermost vias and uppermost vias of a semiconductor integrated circuit are disposed within a zone of wiring tracks, which are superposed by wiring traces of an uppermost wiring layer and wiring traces of a lowermost wiring layer, as seen from the direction normal to the plane. The lowermost vias are disposed so as to fit in a 4-row, 1-column rectangle, and the uppermost vias are disposed so as to fit in a 2-row, 2-column rectangle. The center of a via unit, which comprises the uppermost vias, as seen from the direction normal to the plane is disposed at the intersecting portion of the lowermost wiring layer and uppermost wiring layer. The center of a via unit, which comprises the lower vias, as seen from the direction normal to the plane is offset by a prescribed amount from the center of the via unit, which comprises the uppermost vias, as seen from the direction normal to the plane.

11 Claims, 15 Drawing Sheets

U.S. PATENT DOCUMENTS

| | | | |
|---|---|---|---|
| 7,146,596 B2 * | 12/2006 | Bednar et al. | 716/12 |
| 7,200,831 B2 * | 4/2007 | Kitabayashi | 716/13 |
| 7,215,563 B2 * | 5/2007 | Brandon et al. | 365/94 |
| 2002/0024115 A1 * | 2/2002 | Ibnabdeljalil et al. | 257/620 |
| 2003/0122160 A1 * | 7/2003 | Houston et al. | 257/207 |
| 2004/0012040 A1 * | 1/2004 | Osada et al. | 257/202 |
| 2005/0226068 A1 * | 10/2005 | Brandon et al. | 365/203 |
| 2006/0123367 A1 * | 6/2006 | Sakurabayashi | 716/5 |
| 2008/0107863 A1 * | 5/2008 | Ikeda et al. | 428/137 |
| 2008/0129336 A1 * | 6/2008 | Schmit et al. | 326/41 |

* cited by examiner

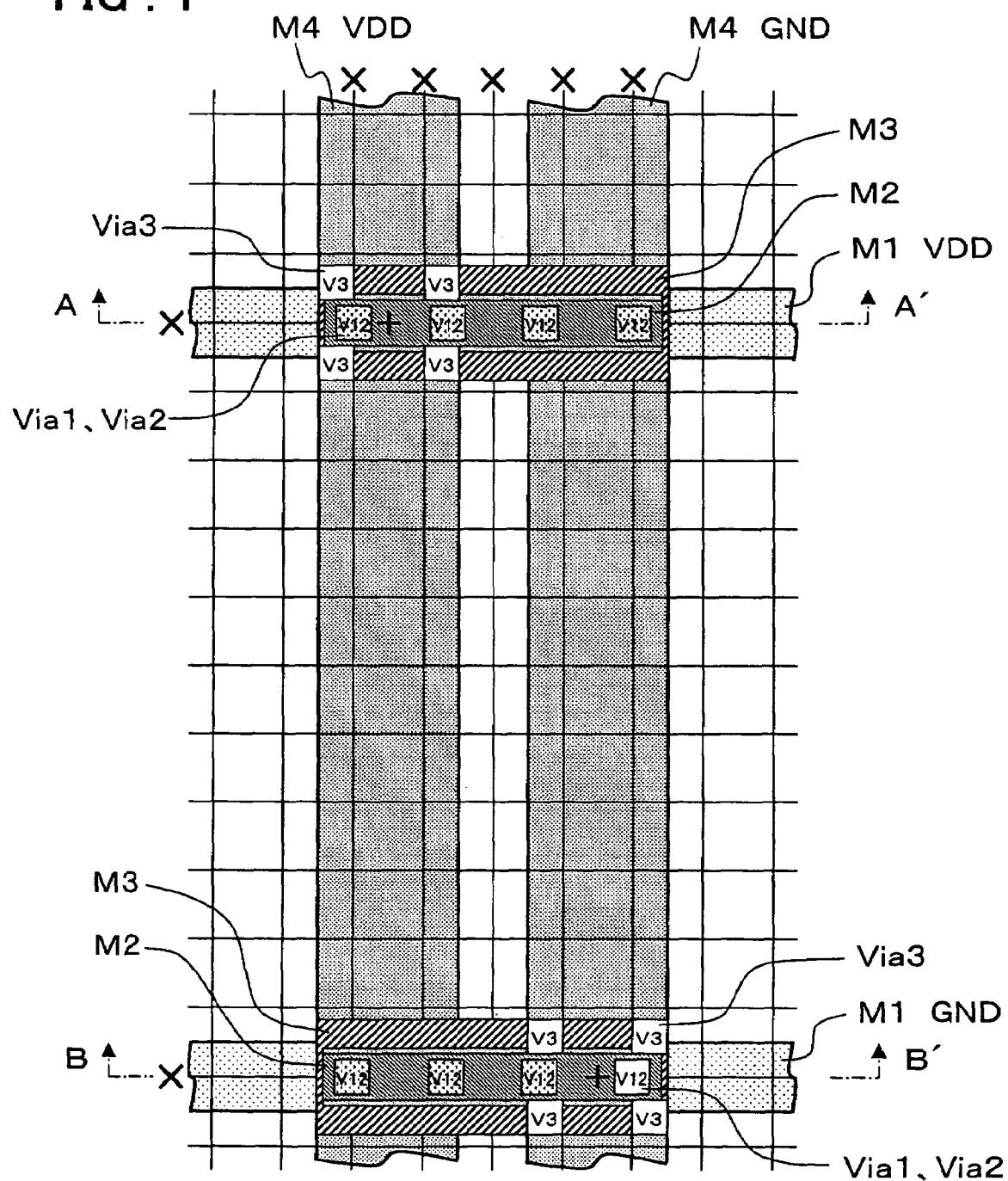

A–A'

B–B'

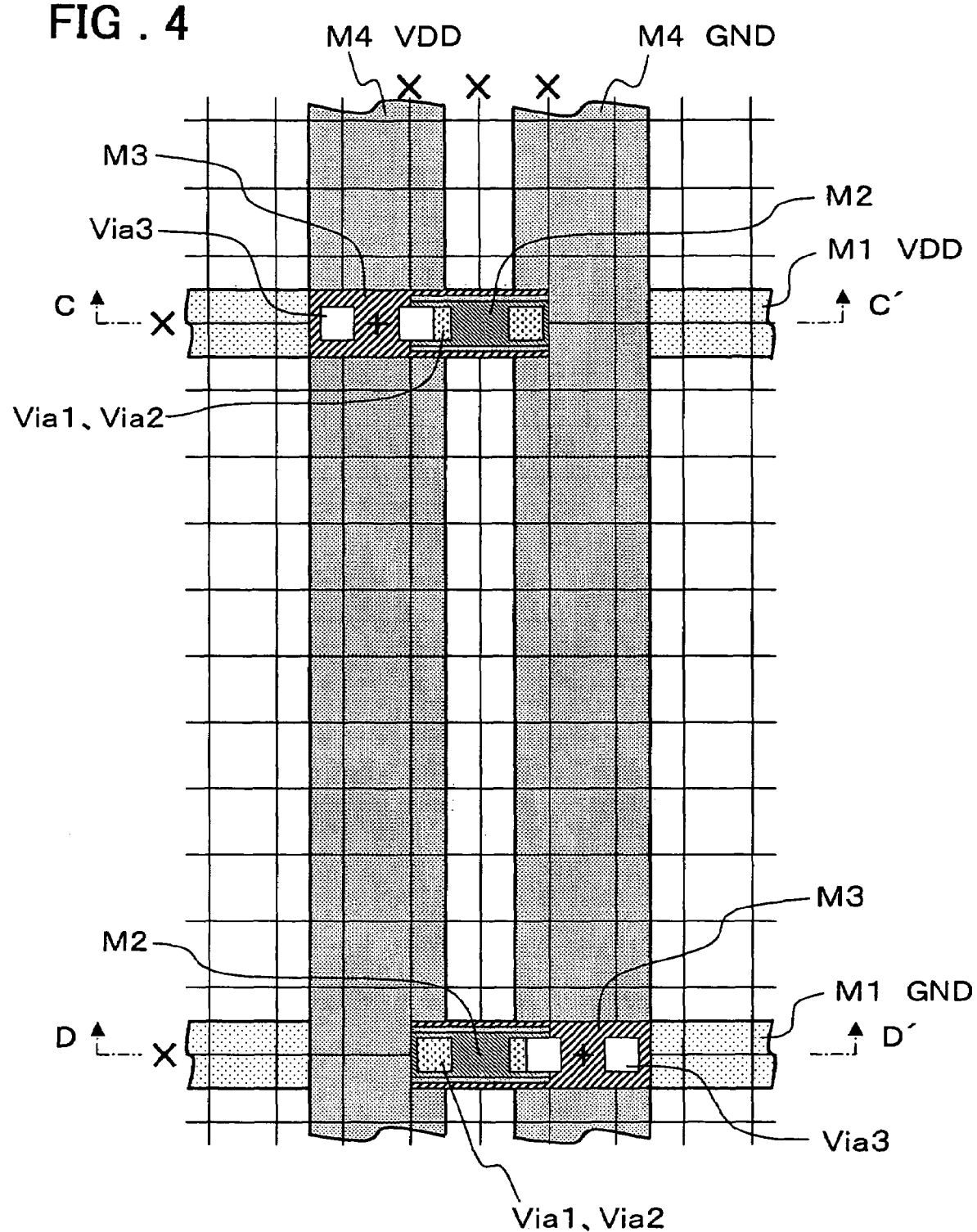

C—C′

D—D′

E−E′

F−F′

G—G'

H—H'

SEMICONDUCTOR INTEGRATED CIRCUIT, LAYOUT METHOD, LAYOUT APPARATUS AND LAYOUT PROGRAM

FIELD OF THE INVENTION

This invention relates to a semiconductor integrated circuit having a wiring structure in which three or more wiring layers each having a single pair of wiring traces of different potentials on a semiconductor substrate are connected by vias, a layout method, apparatus and program. More particularly, the invention relates to a semiconductor integrated circuit, layout method, apparatus and program that are capable of suppressing a decline in wiring ability.

BACKGROUND OF THE INVENTION

In a semiconductor integrated circuit such as an LSI chip, it is necessary to strengthen the structure of the power wiring internally of the semiconductor integrated circuit in order to prevent malfunction caused by a fluctuation in delay ascribable to a voltage drop (IR drop), or failure due to electromigration (EM). Strengthening of the power wiring structure is achieved by adjusting wiring width and the number of vias.

An example of prior art that contemplates strengthening the power wiring structure within a semiconductor integrated circuit is an electromigration verification method that includes a step of calculating the number of power vias required, specifically a step of calculating the number of required power vias, which are connected to a data bus, from the number of power main lines in the top layer of the data bus when the data bus is designed, and storing the number in storage means; a power via checking step of referring to the number of required vias, which have been stored in the storage means, when power wiring is performed at the chip level, and checking to determine whether the number of required power vias connected to the data bus satisfies the required number (see FIG. 12, Patent Document 1). In accordance with this method, chip-level EM verification at completion of chip design is made unnecessary, a return to power wiring in a case where an error is found in the chip-level EM verification is eliminated and it is possible to shorten the time involved in the design phase and to improve design efficiency.

Further, in ordinary power wiring processes according to the prior art, the following process is performed automatically based upon a prescribed program using a layout apparatus (CAD apparatus) for designing a semiconductor integrated circuit: As shown in FIG. 13, power wiring preprocessing (e.g., chip-level layout) is executed (step C1); wiring layers (e.g., M1 and M4) each having a pair of power wiring traces (e.g., VDD and GND) of different potentials are generated in parallel at prescribed wiring widths (e.g., a wiring width of A for M4 and a wiring width a for M1) (steps C2 to C5); intersecting portions of the wiring traces of each of the wiring layers are extracted and a via wiring process is performed (e.g., layers M2, M3 and vias 1 to 3 are produced) (step C6); and power wiring post-processing (e.g., power via check and chip-level wiring) is executed (step C7). With regard to the wiring layers (metal wiring layers) concerning M1 to M4, here M1, M2, M3 and M4 represent first, second, third and fourth wiring layers in order starting from the lowermost layer. Further, in order to connect the layers M1 and M4 in the via wiring process, processing for generating Vias 1 connecting M2 with M3 and M1 with M2, Vias 2 connecting M2 and M3 and Vias 3 connecting M3 and M4 is executed for every power wiring trace of corresponding potential in areas that include the intersecting portions of the layers M1 to M4 and the vicinities of these intersections.

With ordinary power wiring according to the prior art, wiring structures of the kind shown in FIGS. 14 to 17 are obtained in a case where four each of Via 1 to Via 4 are required to be disposed between M1 and M4. FIG. 14 is an example of the structure in a case where the width (transverse width) of a 4-column, 1-row via unit (a unit comprising a plurality of vias) is greater than the width of M4. FIG. 15 is an example of the structure in a case where the wiring width of M4 has been enlarged up to the width of a 4-column, 1-row via unit. FIG. 16 is an example of the structure in a case where two sets of a pair of power wiring traces pertaining to M4 have been generated and four 2-column, 1-row via units have been produced. FIG. 17 is an example of the structure in a case where the wiring width of M1 has been enlarged and a 2-column, 2-row via unit produced. According to this via wiring process in power wiring of the prior art, Vias 1, Vias 2 and Vias 3 are generated such that the centers of a first via unit comprising Vias 1, a second via unit comprising Vias 2 and a third via unit comprising Vias 3 will agree and such that these centers will fall within the area of an intersecting portions of the lowermost wiring layer (M1) and uppermost wiring layer (M4). Further, the grid-like lines in FIGS. 14 to 17 are wiring tracks and serve as auxiliary lines when the wiring structure of the semiconductor integrated circuit is designed. In addition, although the intermediate wiring layers (M2 and M3) are generated as layers underlying the uppermost wiring layer (M4), they are illustrated as overlying wiring layer M4 in FIGS. 14 to 17 in order to facilitate description. In FIGS. 14 to 17, the "+" symbols indicate the centers of the via units comprising Vias 1, Vias 2 or Vias 3 as seen from the direction normal to the plane, and the "X" symbols indicate the wiring tracks superposed by lowermost wiring layer (M1), uppermost wiring layer (M4) and vias (via 1 to via 3).

[Patent Document 1]
Japanese Patent Kokai Publication No. JP-P2002-24313A
[Patent Document 2]
Japanese Patent Kokai Publication No. JP-A-9-212661

SUMMARY OF THE DISCLOSURE

As a result of strengthening the power wiring structure within a semiconductor integrated circuit according to the prior art, a problem which arises is a reduction in wiring resources (number of tracks) effects as wiring traces within the semiconductor integrated circuit.

Further, the invention described in Patent Document 1 makes it possible to assure resistance to EM by assuring the required number of vias of the power wiring in advance. However, since there is the danger that wiring ability cannot be improved, a problem which arises is an increase in chip size.

Further, the following problems arise with the structural examples illustrated in FIGS. 14 to 17 (namely the examples for the cases where it is required to place four each of the Vias 1 to Vias 3 between M1 and M4): In the case of the structural example shown in FIG. 14, the width of the via unit as seen from the direction normal to the plane is greater than the wiring width of the uppermost wiring layer (M4). Consequently, there is an increase in the wiring tracks superposed by the vias and by the lowermost wiring layer (M1) and uppermost wiring layer (M4). This reduces the effective wiring resources. In the case of the structural example shown in FIG. 15, the wiring width of M4 is great and effective wiring resources are reduced as a result. In the case of the structural example shown in FIG. 16, the number of wiring traces pertaining to M4 is increased when it is attempted to assure four of each of the vias (Via 1, Via 2, Via 3) between the wiring traces in order to not exacerbate EM. This reduces the effective wiring resources. In the case of the structural example shown in FIG. 17, M1 is enlarged and the effective wiring resources for M1 are reduced. In addition, processing of the wiring formed in the areas of the VDD wiring of M1 and GND wiring of M1 is difficult and cell size increases.

Accordingly, an object of the present invention is to provide a semiconductor integrated circuit, layout method, layout apparatus and layout program that make it possible to suppress a decline in wiring ability.

According to a first aspect of the present invention, there is provided a semiconductor integrated circuit having a wiring structure in which three or more wiring layers each having one pair of wiring traces of different potentials on a semiconductor substrate are connected by vias, the circuit comprising a first wiring layer having one pair of wiring traces of first and second potentials that differ from each other; a second wiring layer disposed in a layer different from the first wiring layer and having one pair of wiring traces of the first and second potentials; and one or a plurality of intermediate wiring layers disposed between the first wiring layer and the second wiring layer. The pair of wiring traces of the first wiring layer are disposed in parallel with a prescribed spacing between them, the pair of wiring traces of the second wiring layer are disposed in parallel with a minimum spacing between them that can render wiring tracks effective, and the wiring traces of the first wiring layer are in a direction perpendicular to the wiring traces of the second wiring layer; the same-potential wiring traces of the first wiring layer and of the second wiring layer are electrically connected through the intermediate wiring layer and vias. As seen from the direction normal to the plane, the intermediate wiring layer is disposed within a zone of wiring tracks superposed by wiring of the first wiring layer and wiring of the second wiring layer. A number of first vias that connect the wiring of the intermediate wiring layer and the wiring of the first wiring layer is m (where m is an integer equal to or greater than 1) and a number of second vias that connect the wiring of the intermediate wiring layer and the wiring of the second wiring layer is m (where m is an integer equal to or greater than 1); the first vias are disposed within a zone of wiring tracks superposed by wiring traces of the second wiring layer and of the first wiring layer as seen from the direction normal to the plane and fit within a rectangular shape of j columns and h rows (where j, h are integers equal to or greater than 1 and j×h≧m holds). The second vias are disposed within a zone of wiring tracks superposed by wiring traces of the second wiring layer and of the first wiring layer as seen from the direction normal to the plane and fit within a rectangular shape of n columns and k rows (where n, k are integers equal to or greater than 1 and n×k≧m holds). The center of a via unit, which comprises the second vias, as seen from the direction normal to the plane is disposed at an intersecting portion of the first wiring layer and second wiring layer; and the center of a via unit for the first potential, as seen from the direction normal to the plane, of via units comprising the first vias is offset by a prescribed amount from the center of the via unit for the first potential, as seen from the direction normal to the plane, toward the side of the wiring of the second potential in the second wiring layer.

According to a second aspect of the present invention, there is provided a method of laying out a semiconductor integrated circuit having a wiring structure in which three or more wiring layers each having one pair of wiring traces of different potentials on a semiconductor substrate are connected by vias. The method comprises the steps of: generating a first wiring layer in which one pair of wiring traces of first and second potentials that differ from each other are disposed in parallel with a prescribed spacing between them, and a second wiring layer disposed in a layer different from the first wiring layer and in which one pair of wiring traces of the first and second potentials are disposed in parallel with a minimum spacing between them that can render wiring tracks effective and are in a direction perpendicular to the wiring traces of the first wiring layer; extracting intersecting portions between the second wiring layer and the first wiring layer as well as wiring widths; and on the basis of information relating to the extracted intersecting portions and wiring widths, generating one or a plurality of intermediate wiring layers disposed between the first wiring layer and the second wiring layer and, as seen from the direction normal to the plane, disposed in a zone of wiring tracks superposed by wiring of the first wiring layer and wiring of the second wiring layer, m-number (where m is an integer equal to or greater than 1) of first vias connecting the wiring of the intermediate wiring layer and the wiring of the first wiring layer, and m-number (where m is an integer equal to or greater than 1) of second vias connecting the wiring of the intermediate wiring layer and the wiring of the second wiring layer. At the step of generating the second vias, the second vias are generated so as to be disposed within a zone of wiring tracks superposed by wiring traces of the second wiring layer and of the first wiring layer as seen from the direction normal to the plane and so as to fit within a rectangular shape of n columns and k rows (where n, k are integers equal to or greater than 1 and n×k≧m holds) and in such a manner that the center of a via unit, which comprises the second vias, as seen from the direction normal to the plane is disposed at an intersecting portion of the first wiring layer and second wiring layer as seen from the direction normal to the plane; and at the step of generating the first vias, the first vias are generated so as to be disposed within a zone of wiring tracks superposed by wiring traces of the second wiring layer and of the first wiring layer as seen from the direction normal to the plane and so as to fit within a rectangular shape of j columns and h rows (where j, h are integers equal to or greater than 1 and j×h≧m holds) and in such a manner that the center of a via unit for the first potential, as seen from the direction normal to the plane, of via units comprising the first vias is offset by a prescribed amount from the center of the via unit for the first potential, as seen from the direction normal to the plane, toward the side of the wiring of the second potential in the second wiring layer.

The functions of the layout method are implemented by executing a program in a layout apparatus (a computer or CAD apparatus). In this case the present invention can be implemented by running the program upon reading it out to a computer from a recording medium (magnetic disk, magnetic tape, optical disk or semiconductor memory, etc.) on which the program has been recorded.

The meritorious effects of the present invention are summarized as follows.

In accordance with the present invention, it is possible to minimize the wiring tracks superposed by the wiring of the first and second wiring layers and by the via units, and effective wiring resources (the number of wiring tracks) can be increased (wiring ability can be improved). Further, since implementation is possible without reducing the number of vias, the invention can be implemented without diminishing resistance to EM.

Further, in accordance with the present invention, layout convergence can be improved (TAT is shortened), an increase in chip size can be suppressed and cost can be reduced.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 1 is a partial plan view schematically illustrating the wiring structure of a semiconductor integrated circuit according to a first embodiment of the present invention;

FIGS. 2A and 2B show partial sectional views schematically illustrating the wiring structure of the semiconductor integrated circuit according to the first embodiment, in which FIGS. 2A and 2B are partial sectional views taken along lines A-A' and B-B', respectively, of FIG. 1;

FIGS. 3A and 3B show partial plan views schematically illustrating a modification of the wiring structure of the semiconductor integrated circuit according to the first embodiment, in which FIG. 3A illustrates a layer M3 in a T-shaped configuration and FIG. 3B the layer M3 in an L-shaped configuration;

FIG. 4 is a partial plan view schematically illustrating the wiring structure of a semiconductor integrated circuit according to a second embodiment of the present invention;

FIGS. 5A and 5B show partial sectional views schematically illustrating the wiring structure of the semiconductor integrated circuit according to the second embodiment, in which FIGS. 5A and 5B are partial sectional views taken along lines C-C' and D-D', respectively;

FIGS. 7A and 7B show partial sectional views schematically illustrating the wiring structure of the semiconductor integrated circuit according to the third embodiment, in which FIGS. 7A and 7B are partial sectional views taken along lines E-E' and F-F', respectively;

FIGS. 9A and 9B show partial sectional views schematically illustrating the wiring structure of the semiconductor integrated circuit according to the fourth embodiment, in which FIGS. 9A and 9B are partial sectional views taken along lines G-G' and H-H', respectively;

FIGS. 10A, 10B and 10C show partial plan views schematically illustrating the wiring structure of a semiconductor integrated circuit according to a fifth embodiment of the present invention, in which FIG. 10A illustrates the positions of vias, which are other than vias connected to an uppermost wiring layer, at standard positions, FIG. 10B the positions of vias, which are other than vias connected to an uppermost wiring layer, offset to the left side, and FIG. 10C the positions of vias, which are other than vias connected to an uppermost wiring layer, offset to the right side;

PREFERRED EMBODIMENTS OF THE INVENTION

First Embodiment

Figure 2A:
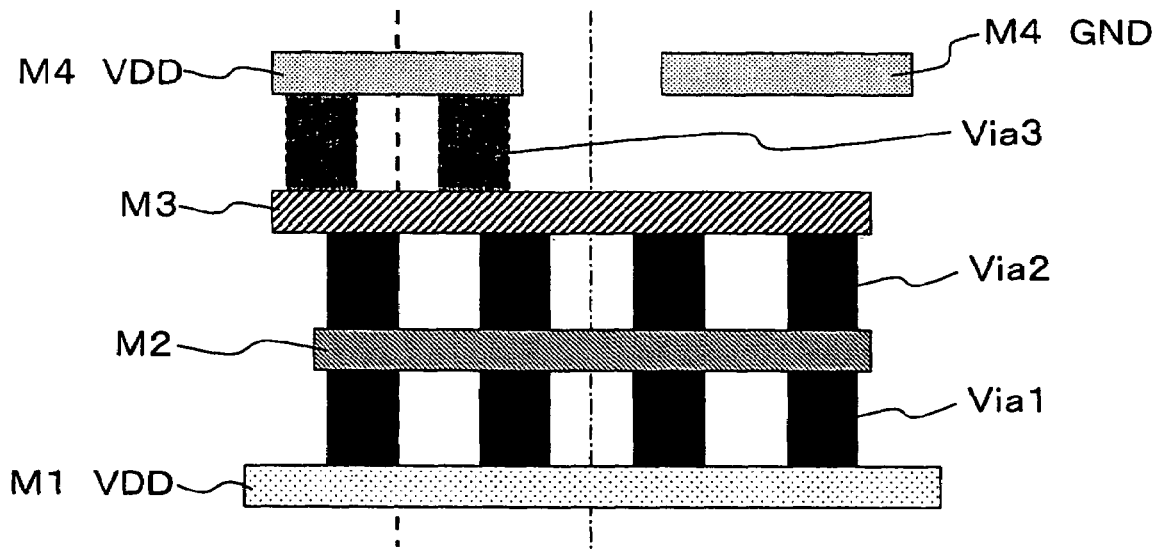
Figure 2B:
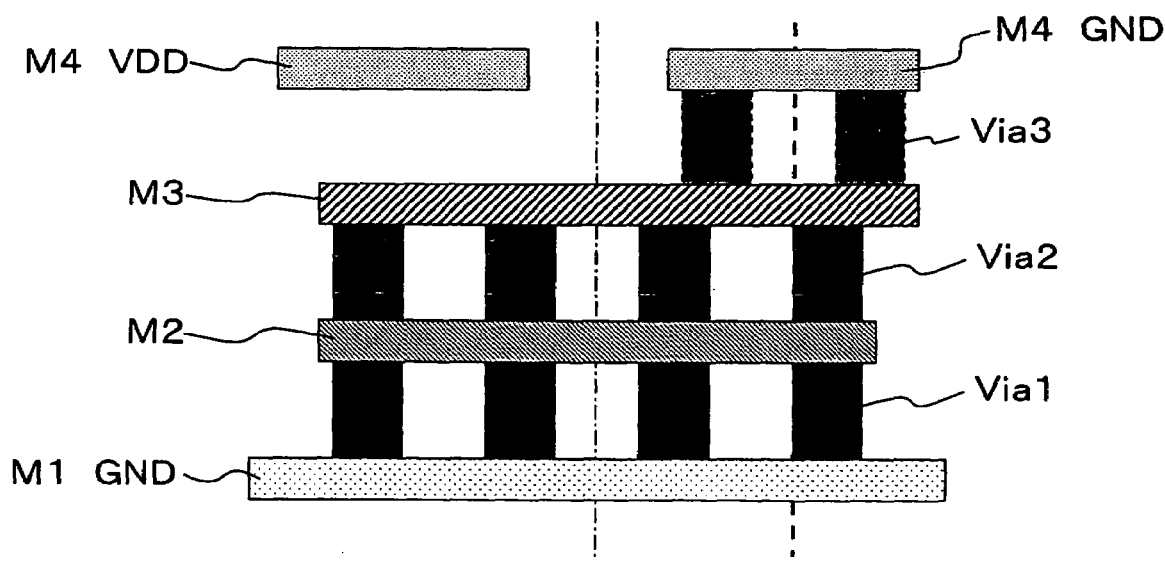

A first embodiment of the present invention will be described with reference to the drawings. FIG. 1 is a partial plan view schematically illustrating the wiring structure of a semiconductor integrated circuit according to a first embodiment of the present invention, and FIGS. 2A and 2B show partial sectional views schematically illustrating the wiring structure of the semiconductor integrated circuit according to the first embodiment, in which FIGS. 2A and 2B are partial sectional views taken along lines A-A' and B-B', respectively. In FIGS. 2A and 2B, Via 3 is illustrated to facilitate the description although it is not actually visible in this cross section. Further, the grid-like lines in FIG. 1 are wiring tracks (a wiring grid) and serve as auxiliary lines when the wiring structure of the semiconductor integrated circuit is designed. Furthermore, the "+" symbols indicate the centers of via units comprising vias (Vias 3), which connect to the uppermost wiring layer (M4), as seen from the direction normal to the plane, and the "X" symbols indicate the wiring tracks superposed by vias (Vias 1 and Vias 2) other than the vias (Vias 3) that connect to the uppermost wiring layer (M4).

Figure 3A:
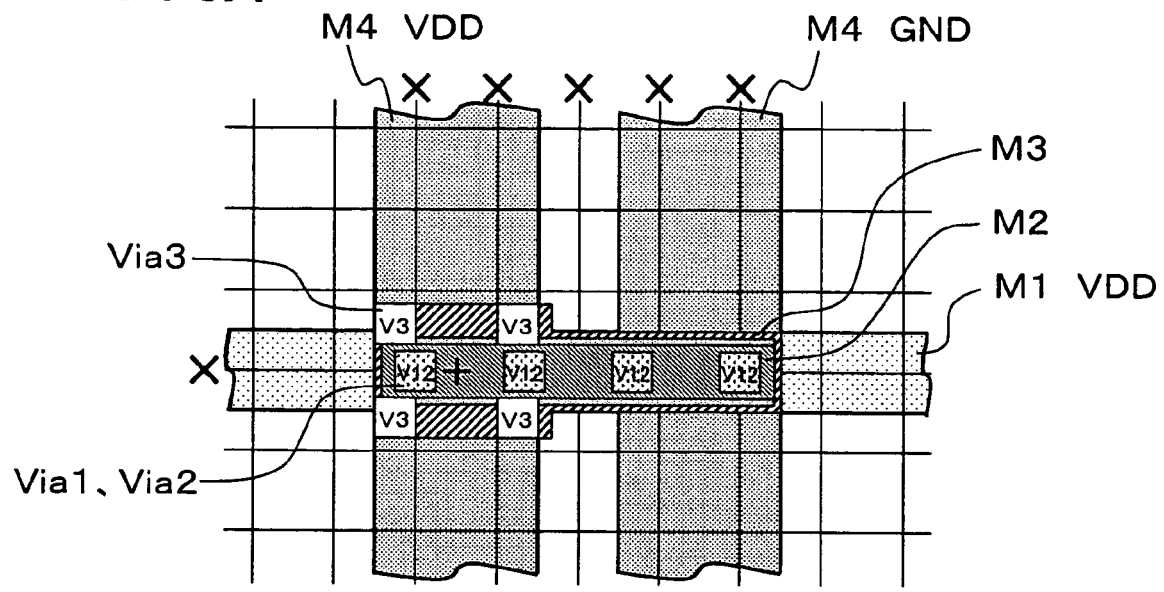
Figure 3B:
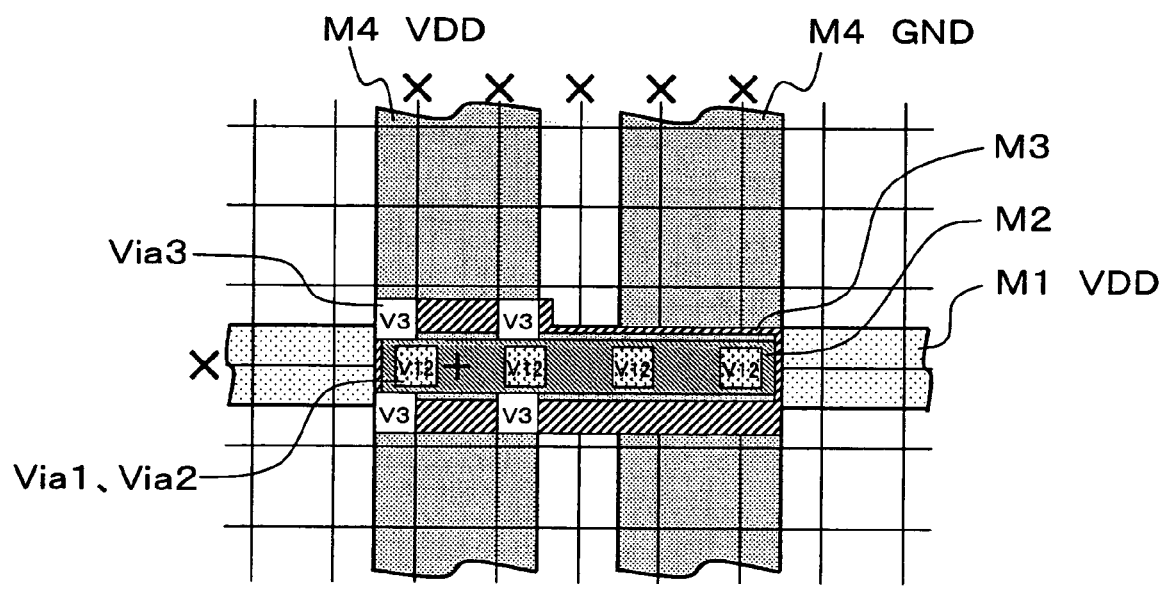

With the wiring structure of the semiconductor integrated circuit according to the first embodiment, wiring (M1) in a first wiring layer, a second wiring layer (M2), a third wiring layer (M3) and a fourth wiring layer (M4) are disposed in the order mentioned starting from the lowermost layer. The wiring layers (M1 to M4) are disposed with a prescribed spacing between them in the direction in which they are stacked, and inter-layer insulating films (not shown) are interposed between the wiring layers (M1 to M4). In FIGS. 1 and 2, M1 is the lowermost wiring layer and M4 the uppermost wiring layer. Although M1 and M4 are adopted as the lowermost and uppermost wiring layers, respectively, for the sake of convenience, M1 and M4 may just as well be adopted as the uppermost and lowermost wiring layers, respectively. Each of the wiring layers (M1 to M4) has a single pair of power wiring traces of mutually different potentials (VDD, GND, etc.). The pair of power wiring traces in each of the wiring layers (M1 to M4) are disposed in parallel with a prescribed spacing between them. It should be noted that the wiring widths of the pair of power wiring traces in each of the wiring layers (M1 to M4) may be the same as or different from one another. The VDD wiring traces (first wiring traces) of each of the wiring layers (M1 to M4) are electrically connected by vias Via 1 to Via 3 on the VDD side and are isolated from the GND wiring traces (second wiring traces) of each of the wiring layers (M1 to M4) and from the vias Via 1 to Via 3 on the GND side. The GND wiring traces (second wiring traces) of each of the wiring layers (M1 to M4) are electrically connected by vias Via 1 to Via 3 on the GND side and are isolated from the VDD wiring traces (first wiring traces) of each of the wiring layers (M1 to M4) and from the vias Via 1 to Via 3 on the VDD side. Further, the wiring traces (M4) of the uppermost wiring layer and the wiring traces (M1) of the lowermost wiring layer are disposed mutually perpendicular in a direction as seen from the direction normal to the plane. The illustrated intermediate wiring layers (M2 and M3) are wiring layers in order to electrically connect the lowermost wiring layer (M1) and the uppermost wiring layer (M4). As seen from the direction normal to the plane, the intermediate wiring layer (M3) immediately underlying the uppermost wiring layer (M4) is disposed within a zone of wiring tracks superposed (overlapped) by the uppermost wiring layer (M4) in an area that includes the intersecting portion (intersection) between the lowermost wiring layer (M1) and uppermost wiring layer (M4). As seen from the direction normal to the plane, the intermediate wiring layer (M2), which is the intermediate layer other than the one immediately underlying the uppermost wiring layer (M4), is disposed within a zone of wiring tracks superposed by the uppermost wiring layer (M4) in an area that includes one or both of the pair of wiring traces of the uppermost wiring layer (M4). Preferably, the wiring length of the intermediate wiring layer (M3) immediately underlying the uppermost wiring layer (M4) is equal to or greater than the wiring length of the intermediate wiring layer (M2), which is intermediate layer than the one immediately underlying the uppermost wiring layer (M4). Preferably, the wiring width of the intermediate wiring layer (M3) underlying the uppermost wiring layer (M4) is equal to or greater than the wiring width of the intermediate wiring layer (M2), which is intermediate layer than the one immediately underlying the uppermost wiring layer (M4). Further, the intermediate wiring layers (M2 and M3) are disposed along the wiring direction of the lowermost wiring layer (M1) as seen from the direction normal to the plane. Although the intermediate wiring layer (M3) is formed as a rectangular shape as seen from the direction normal to the plane in FIG. 1, it may just as well be formed in a T-shaped configuration [see FIG. 3A] or in an L-shaped configuration [see FIG. 3B].

Vias (Via 1, Via 2, Via 3) are disposed between the power wiring layers (M1 to M4). Via 1, Via 2 and Via 3 are disposed at prescribed positions (see the "X" symbols in FIG. 1) on the wiring tracks superposed by the lowermost wiring layer (M1) and uppermost wiring layer (M4). (If there are a plurality of each of the vias, then these vias are disposed with a prescribed spacing between them.) There are disposed m-number (where m is an integer equal to or greater than 1, with m=4 holding in FIG. 1) of first vias (Via 1) on each of the VDD and GND sides between the lowermost wiring layer (M1) and intermediate wiring layer (M2). The first vias are disposed so as to fit within a rectangular shape of j columns and h rows (where j, h are integers equal to or greater than 1 and j×h≧m holds, j=4, h=1 holding in FIG. 1) as seen from the direction normal to the plane and are electrically connected to the layers M1 and M2. Vias 1 connected to the VDD wiring and Vias 1 connected to the GND wiring are disposed on the same axis the direction of which is the same as that of the wiring of the uppermost wiring layer (M4). There are disposed m-number (where m is an integer equal to or greater than 1, with m=4 holding in FIG. 1) of Vias 2 on each of the VDD and GND sides between the intermediate wiring layer (M2) and intermediate wiring layer (M3). These vias are disposed so as to fit within a rectangular shape of j columns and h rows (where j, h are integers equal to or greater than 1 and j×h≧m holds, j=4, h=1 holding in FIG. 1) and are electrically connected to the layers M2 and M3. The Vias 2 are disposed at positions where they are superimposed upon the Vias 1 as seen from the direction normal to the plane. The center of a via unit (the 4-column, 1-row via unit in FIG. 1), which comprises the Vias 2 (the vias disposed between the layers M1 and M2), as seen from the direction normal to the plane agrees with the center of a via unit (the 4-column, 1-row via unit in FIG. 1), which comprises the Vias 1 (the vias disposed between the layers M1 and M2), as seen from the direction normal to the plane, and is disposed in an area in which the wiring (M1) in the lowermost wiring layer and intermediate wiring layers (M2, M3) overlap as seen from the direction normal to the plane. There are disposed m-number (where m is an integer equal to or greater than 1, with m=4 holding in FIG. 1) of Vias 3 on each of the VDD and GND sides between the intermediate wiring layer (M3) and uppermost wiring layer (M4). These vias are disposed so as to fit within a rectangular shape of n columns and k rows (where n, k are integers equal to or greater than 1 and n×k≧m holds, n=2, k=2 holding in FIG. 1) and are electrically connected to the layers M3 and M4. The centers of the via units comprising the Vias 1 and the Vias 2 as seen from the direction normal to the plane are disposed at positions offset from the center of a via unit, which comprises the Vias 3, as seen from the direction normal to the plane. In other words, the center of a via unit, which comprises vias (Vias 1 or Vias 2) other than the vias connected to the uppermost wiring layer (M4), as seen from the direction normal to the plane is disposed at a position that is offset from a via unit (the 2-column, 2-row via unit in FIG. 1), which comprises the vias (Vias 3) connected to the uppermost wiring layer (M4), as seen from the direction normal to the plane. Furthermore, of the via units comprising vias (Vias 1 or Vias 2), the center of that via unit, as seen from the direction normal to the plane, on the VDD side is offset toward the side of the GND wiring of the uppermost wiring layer (M4) from the center, as seen from the direction normal to the plane, of the via unit on the VDD side of the via units comprising Vias 3. In addition, of the via units comprising vias (Vias 1 or Vias 2), the center of that via unit, as seen from the direction normal to the plane, on the GND side is offset toward the side of the VDD wiring of the uppermost wiring layer (M4) from the center, as seen from the direction normal to the plane, of the via unit on the GND side in the via units comprising Vias 3. The center of the via unit, which comprises vias (Vias 3) connected to the uppermost wiring layer (M4), as seen from the direction normal to the plane is disposed in an area in which at least the lowermost wiring layer (M1), the intermediate wiring layer (M3) immediately underlying the uppermost wiring layer (M4) and the uppermost wiring layer (M4) overlap. It should be noted that there is also an instance where the center of the via unit comprising the vias (Vias 3) connected to the uppermost wiring layer (M4) as seen from the direction normal to the plane is not disposed in the area of the intermediate wiring layer (M2), which is the intermediate wiring layer other than the one immediately underlying the uppermost wiring layer (M4) (see FIGS. 4, 5 and 7). Further, Via 1, Via 2, Via 3 are disposed in correspondence with the VDD and GND sides.

In accordance with the first embodiment, use of effective resources can be minimized without diminishing EM resistance of the power wiring. In other words, effective wiring resources can be assured and wiring ability improved without reducing the number of vias.

Second Embodiment

Figure 5A:
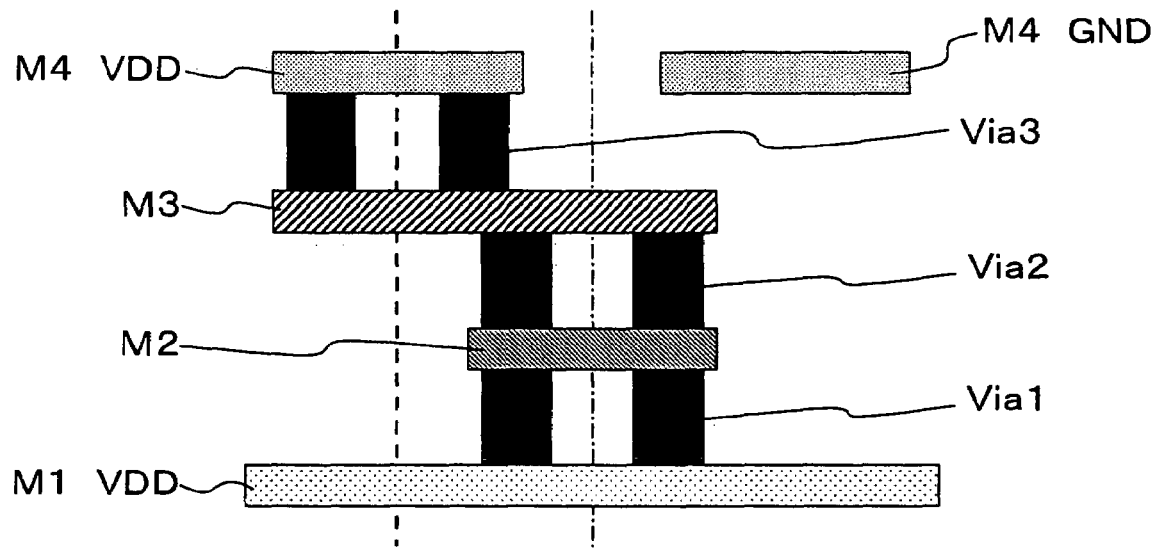
Figure 5B:
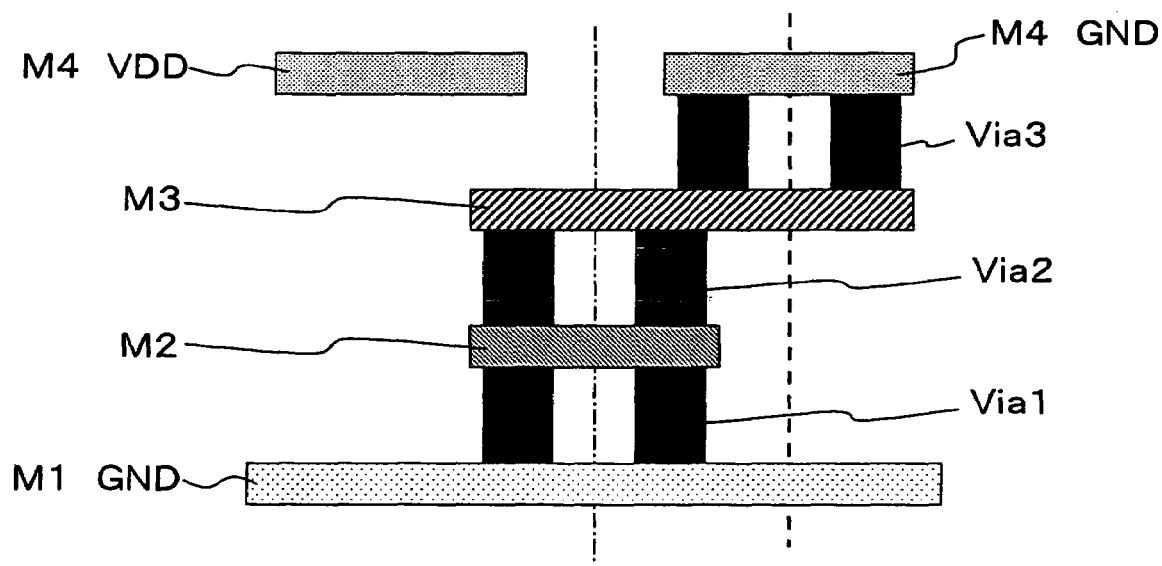

A second embodiment of the present invention will now be described with reference to the drawings. FIG. 4 is a partial plan view schematically illustrating the wiring structure of a semiconductor integrated circuit according to a second embodiment of the present invention, and FIGS. 5A and 5B show partial sectional views schematically illustrating the wiring structure of the semiconductor integrated circuit according to the second embodiment, in which FIGS. 5A and 5B are partial sectional views taken along lines C-C' and D-D', respectively. The grid-like lines in FIG. 4 are wiring tracks (a wiring grid) and serve as auxiliary lines when the wiring structure of the semiconductor integrated circuit is designed. Furthermore, the "+" symbols indicate the centers of via units comprising vias (Vias 3), which connect to the uppermost wiring layer (M4), as seen from the direction normal to the plane, and the "X" symbols indicate the wiring tracks superposed by vias (Vias 1 and Vias 2) other than the vias (Vias 3) that connect to the uppermost wiring layer (M4). The second embodiment is an example of a case where two each of Vias 1 to 3 (two each in 2-column, 1-row arrays) are provided for each different potential. The numbers of vias (Vias 1 to 3) between the wiring layers can be set appropriately to two, three, four, five or six and so on without being limited to two. The second embodiment provides actions and effects similar to those of the first embodiment.

Third Embodiment

Figure 6:
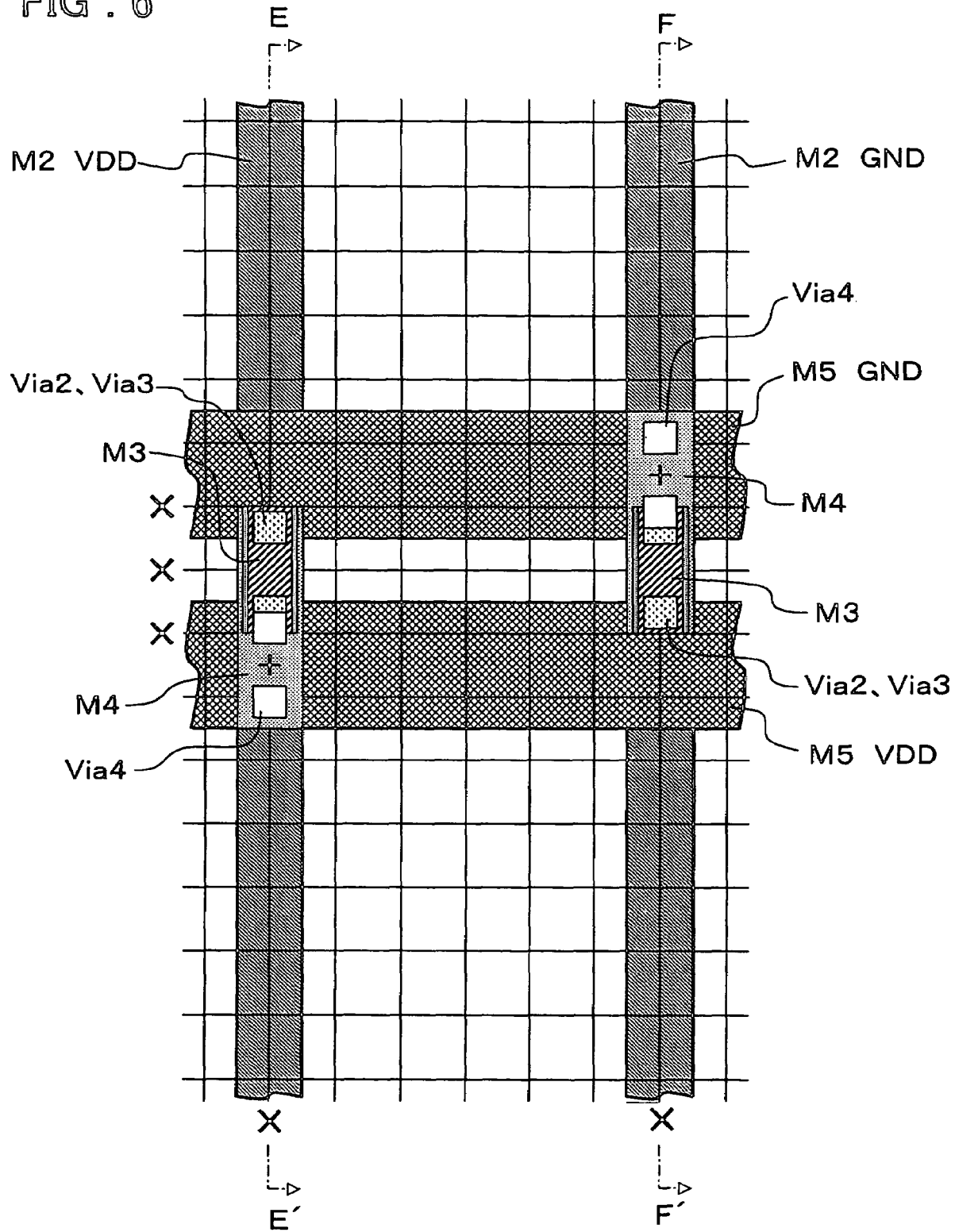
FIG. 6 is a partial plan view schematically illustrating the wiring structure of a semiconductor integrated circuit according to a third embodiment of the present invention.
Figure 7A:
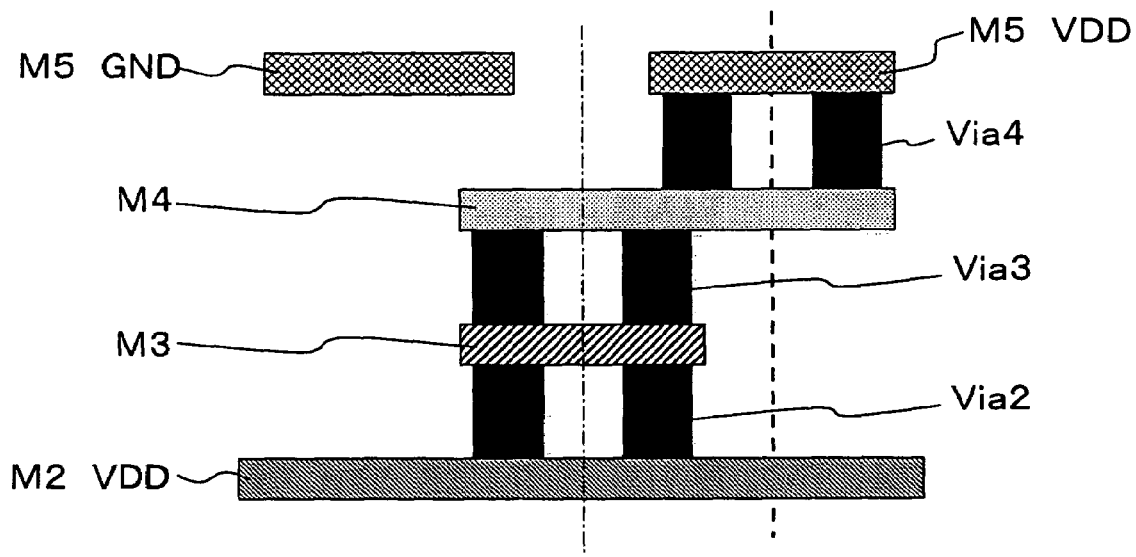
Figure 7B:
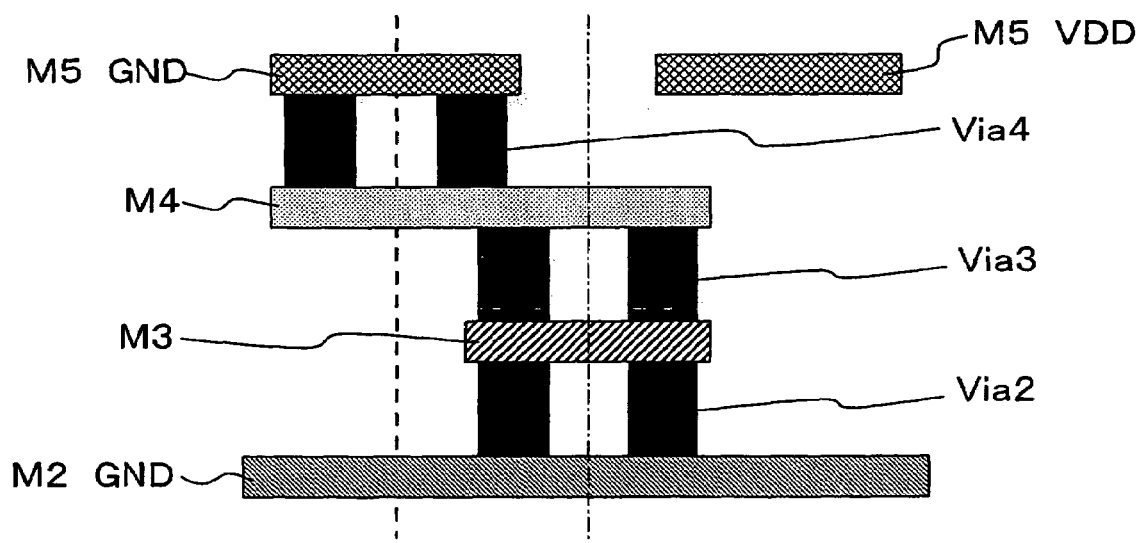

A third embodiment of the present invention will now be described with reference to the drawings. FIG. 6 is a partial plan view schematically illustrating the wiring structure of a semiconductor integrated circuit according to a third embodiment of the present invention, and FIGS. 7A and 7B show partial sectional views schematically illustrating the wiring structure of the semiconductor integrated circuit according to the third embodiment, in which FIGS. 7A and 7B are partial sectional views taken along lines E-E' and F-F', respectively. The grid-like lines in FIG. 6 are wiring tracks (a wiring grid) and serve as auxiliary lines when the wiring structure of the semiconductor integrated circuit is designed. Furthermore, the "+" symbols in FIG. 6 indicate the centers of via units comprising vias (Vias 4), which connect to an uppermost wiring layer (M5), as seen from the direction normal to the plane, and the "X" symbols indicate the wiring tracks superposed by vias (Vias 2 and Vias 3) other than the vias (Vias 4) that connect to the uppermost wiring layer (M5). The third embodiment is an example of a case where two each of Vias 2 to 4 (two each in 1-column, 2-row arrays) are provided for each different potential. The center of a via unit (a 1-column, 2-row via unit), which comprises vias (Vias 4) connected to the uppermost wiring layer (M5), as seen from the direction normal to the plane is disposed at a position that is offset longitudinally from the center of a via unit, which comprises Vias 2 (or Vias 3), as seen from the direction normal to the plane. Furthermore, of the via units comprising Vias 4, the center of that via unit, as seen from the direction normal to the plane, on the VDD side is offset toward the side of the GND wiring of the uppermost wiring layer (M5) from the center, as seen from the direction normal to the plane, of the via unit on the VDD side in the via units comprising Vias 2. In addition, of the via units comprising Vias 4, the center of that via unit, as seen from the direction normal to the plane, on the GND side is offset toward the side of the VDD wiring of the uppermost wiring layer (M5) from the center, as seen from the direction normal to the plane, of the via unit on the VDD side in the via units comprising Vias 2. The direction of offset of the center of the via unit as seen from the direction normal to the plane can be set appropriately. That is, the via unit can be offset to the left or right, up or down or diagonally, etc. The third embodiment provides actions and effects similar to those of the first embodiment.

Fourth Embodiment

Figure 8:
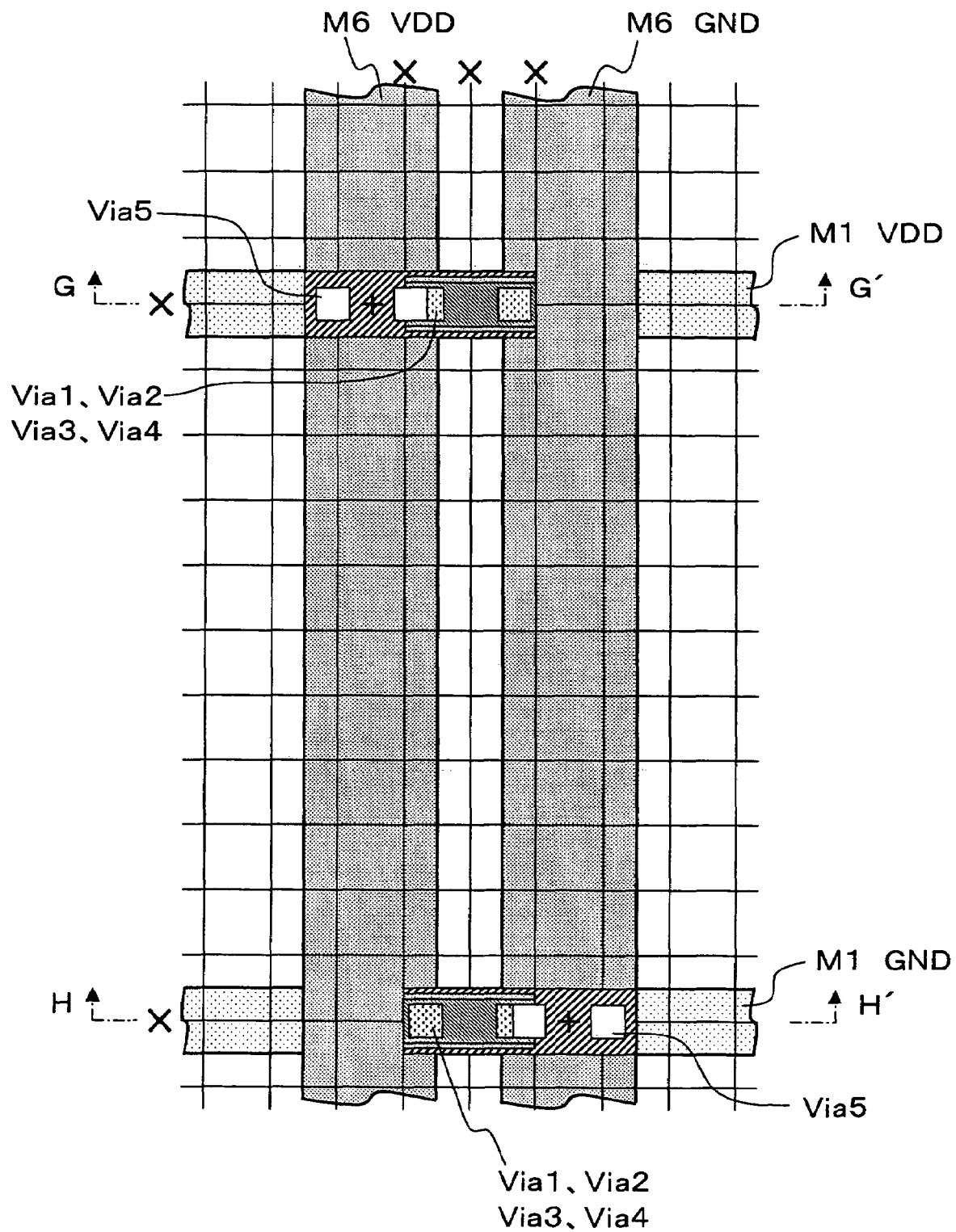
FIG. 8 is a partial plan view schematically illustrating the wiring structure of a semiconductor integrated circuit according to a fourth embodiment of the present invention.
Figure 9A:
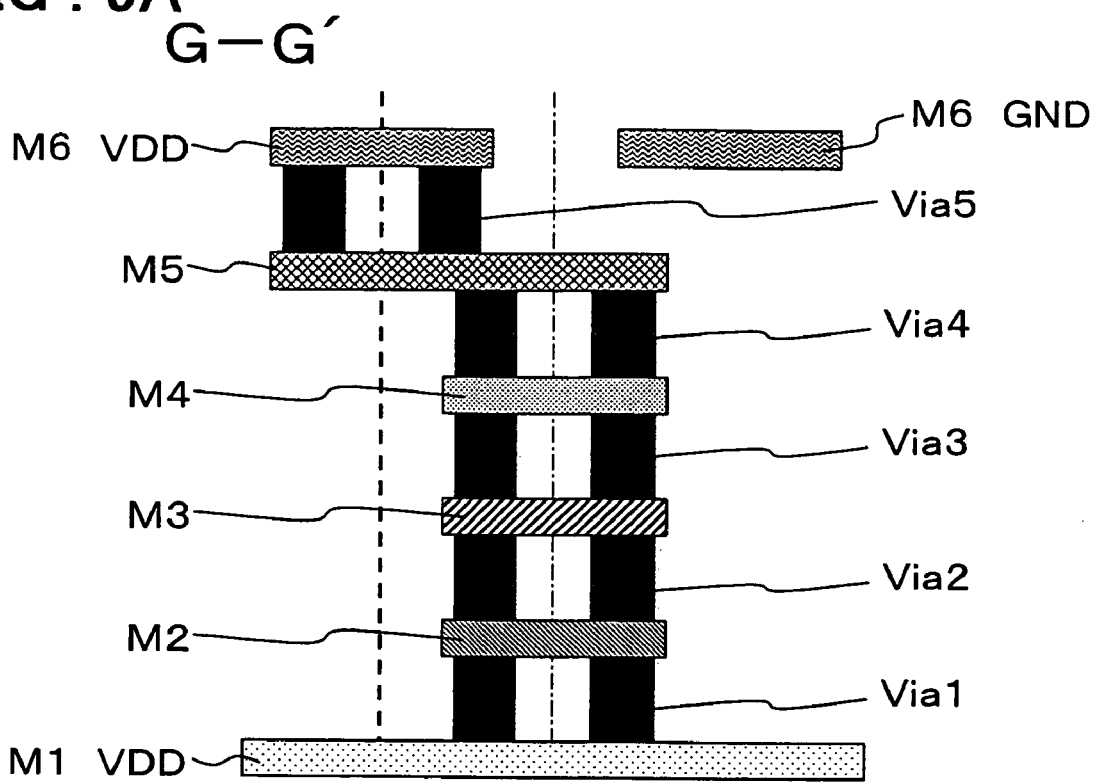
Figure 9B:
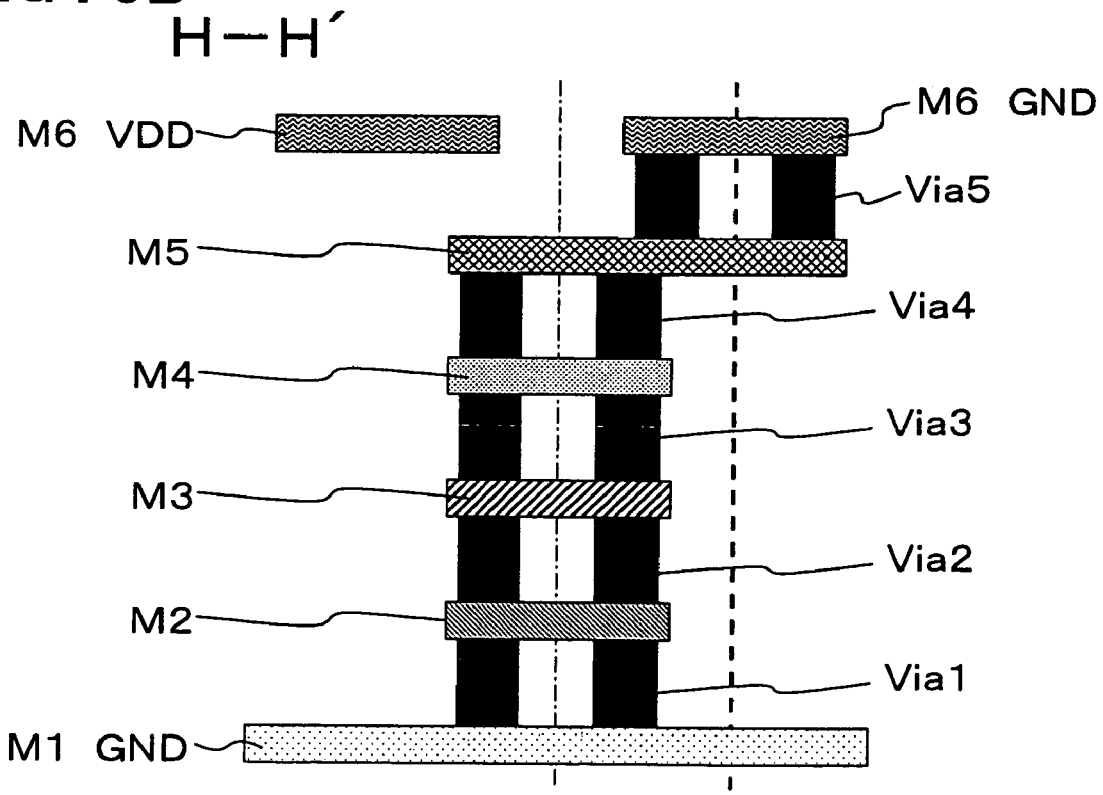

A fourth embodiment of the present invention will now be described with reference to the drawings. FIG. 8 is a partial plan view schematically illustrating the wiring structure of a semiconductor integrated circuit according to a fourth embodiment of the present invention, and FIGS. 9A and 9B show partial sectional views schematically illustrating the wiring structure of the semiconductor integrated circuit according to the third embodiment, in which FIGS. 9A and 9B are partial sectional views taken along lines G-G' and H-H', respectively. The grid-like lines in FIG. 8 are wiring tracks (a wiring grid) and serve as auxiliary lines when the wiring structure of the semiconductor integrated circuit is designed. Furthermore, the "+" symbols in FIG. 8 indicate the centers of via units comprising vias (Via 5), which connect to an uppermost wiring layer (M6), as seen from the direction normal to the plane, and the "X" symbols indicate the wiring tracks superposed by vias (Vias 1, Vias 2, Vias 3, Vias 4) other than the vias (Vias 5) that connect to the uppermost wiring layer (M6). The fourth embodiment is an example of a case where there are six wiring layers (M1 to M6). The number of wiring layers can be set appropriately to three or more and is not limited to six. The fourth embodiment provides actions and effects similar to those of the first embodiment.

Fifth Embodiment

Figure 10A:
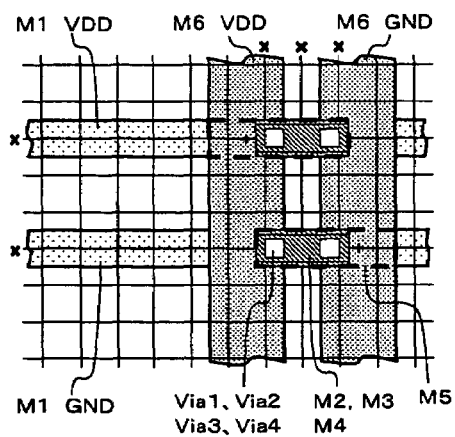
Figure 10B:
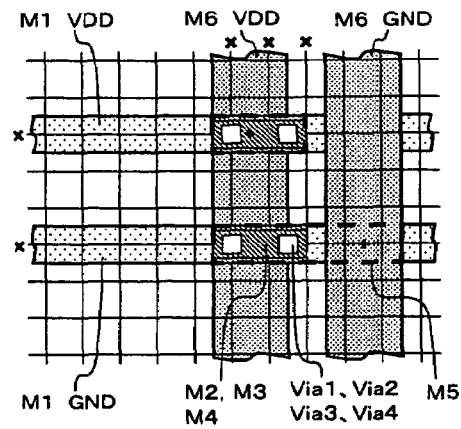
Figure 10C:
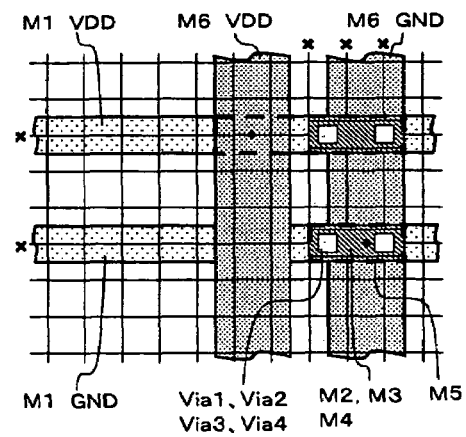

A fifth embodiment of the present invention will now be described with reference to the drawings. FIGS. 10A, 10B and 10C show partial plan views schematically illustrating the wiring structure of a semiconductor integrated circuit according to a fifth embodiment of the present invention, in which FIG. 10A illustrates the positions of vias (Via 1, Via 2, Via 3, Via 4), which are other than vias connected to an uppermost wiring layer (M6), at standard positions, FIG. 10B the positions of vias (Vias 1, Vias 2, Vias 3, Vias 4), which are other than vias connected to an uppermost wiring layer, offset to the left side, and FIG. 10C the positions of vias (Vias 1, Vias 2, Vias 3, Vias 4), which are other than vias connected to an uppermost wiring layer, offset to the right side. It should be noted that Vias 5 connected to the uppermost wiring layer (M6) are not shown in FIG. 10 for the sake of description since the centers of the via units comprising Vias 5 as seen from the direction normal to the plane are fixed at the positions of the "+" symbols. Further, the intermediate wiring layer (M5) immediately underlying the uppermost wiring layer (M6) is represented by the phantom lines. The grid-like lines in FIG. 10 are wiring tracks (a wiring grid) and serve as auxiliary lines when the wiring structure of the semiconductor integrated circuit is designed. The "X" symbols indicate the wiring tracks superposed by vias (Vias 1, Vias 2, Vias 3, Vias 4) other than the vias (Vias 5) that connect to the uppermost wiring layer (M6). In the fifth embodiment, the positions of vias (Vias 1 to Vias 4) other than the vias connected to the uppermost wiring layer (M6) have been offset transversely by a prescribed amount. If the vias (Vias 1 to Vias 4) other than the vias connected to the uppermost wiring layer (M6) are disposed within a zone of wiring tracks superposed by the uppermost wiring layer (M6) and lowermost wiring layer (M1), then the amount of offset can be set appropriately. The vias (Vias 1 to Vias 4) connected to the VDD wiring and the vias (Vias 1 to Vias 4) connected to the GND wiring are disposed on the same axis the direction of which is the same as that of the wiring of the uppermost wiring layer (M6). In conformity with this, the intermediate wiring layers (M2 to M4) other than the intermediate wiring layer (M5) immediately underlying the uppermost wiring layer (M6) also are offset transversely. In other words, the intermediate wiring layers (M2 to M4) are disposed so as to overlap one or both of the pair of wiring traces of the uppermost wiring layer (M6). Further, the length of the intermediate wiring layer (M5) immediately underlying the uppermost wiring layer (M6) is adjusted correspondingly. The fifth embodiment provides actions and effects similar to those of the first embodiment.

Sixth Embodiment

Figure 11:
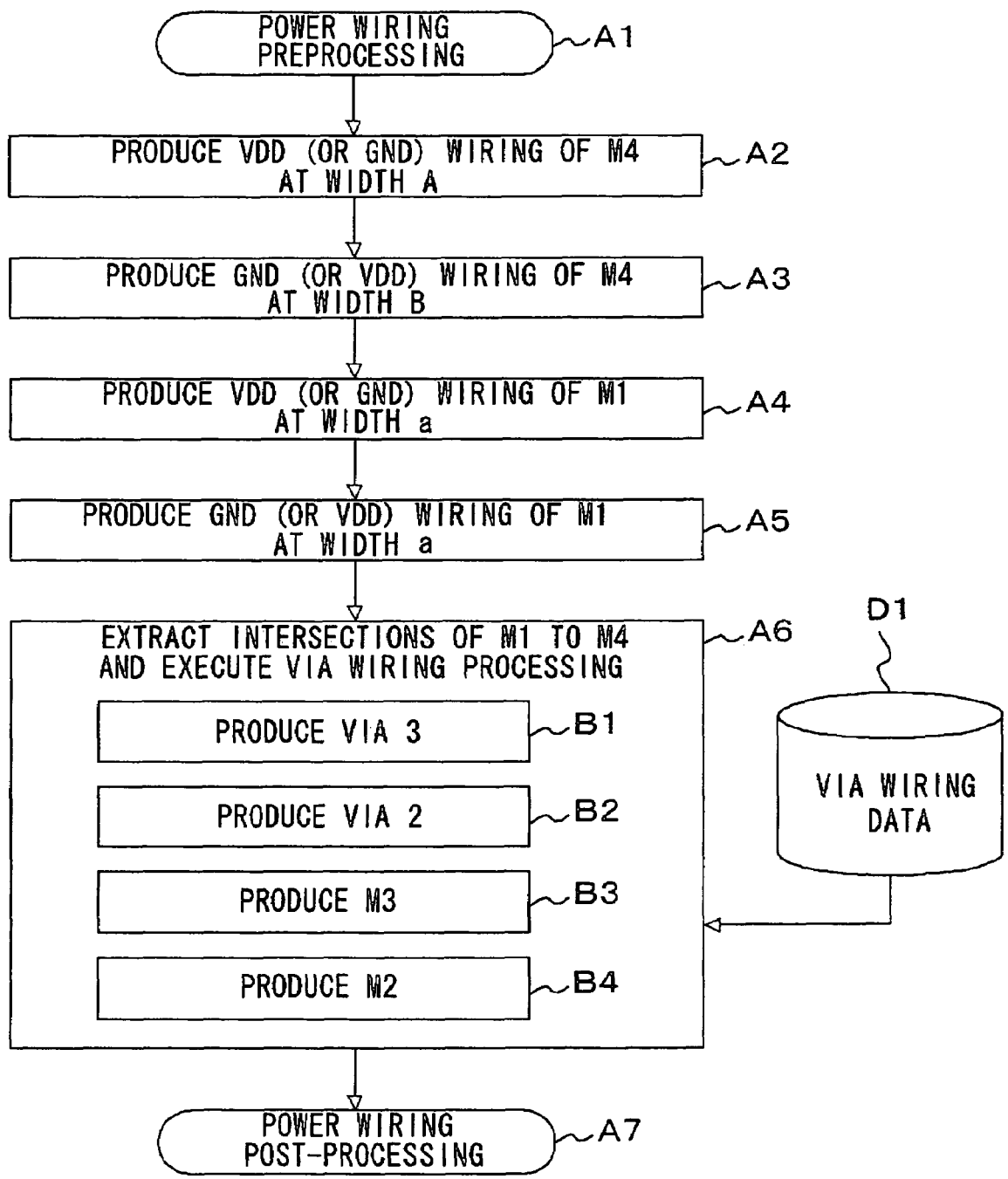
FIG. 11 is a flowchart illustrating a method of laying out the structure of wiring of a semiconductor integrated circuit according to a sixth embodiment of the present invention.
Figure 12:
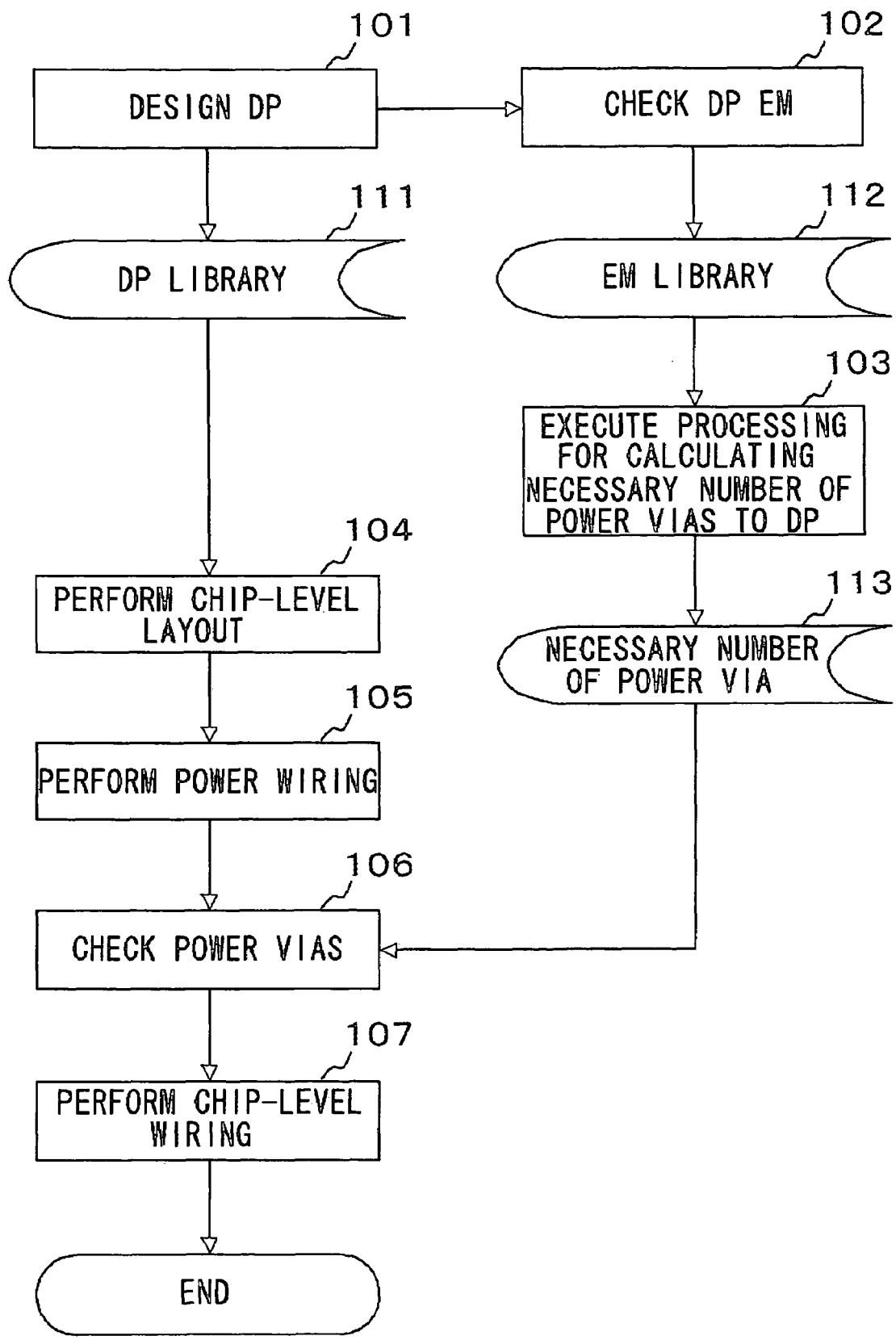
FIG. 12 is a flowchart useful in describing the processing of a method of checking electromigration according to the prior art.
Figure 13:
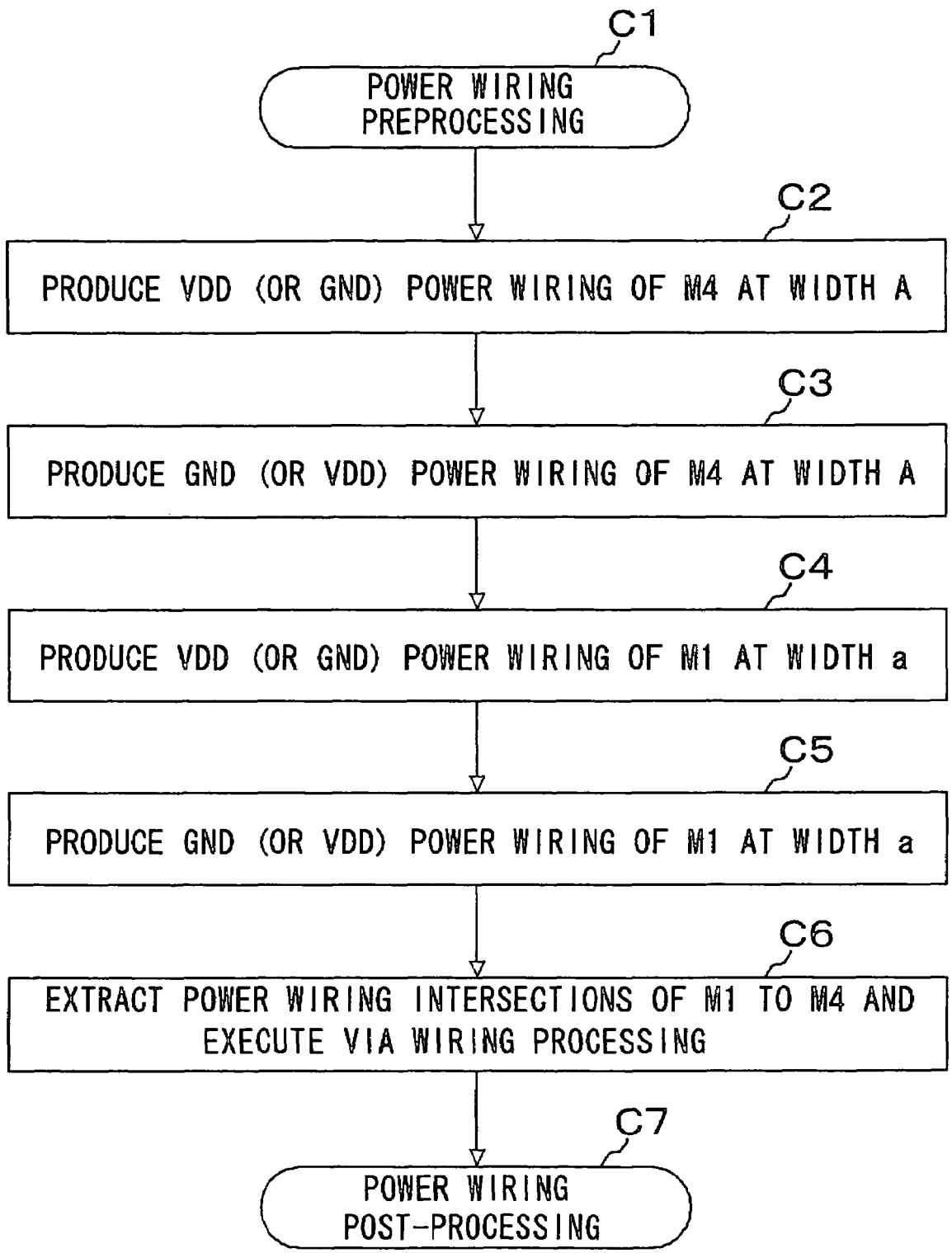
FIG. 13 is a flowchart useful in describing a power wiring process according to the prior art.
Figure 14:
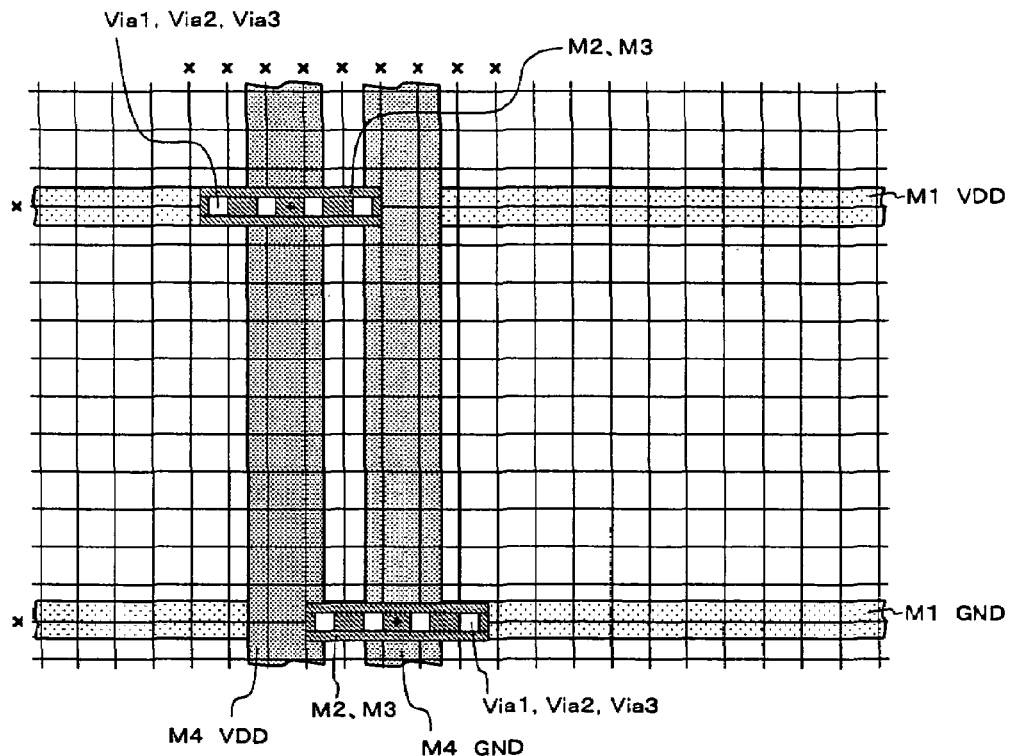
FIG. 14 is a partial plan view schematically illustrating structure in a case where the width of a 4-column, 1-row via unit is greater than the width of M4 according to a conventional power wiring process.
Figure 15:
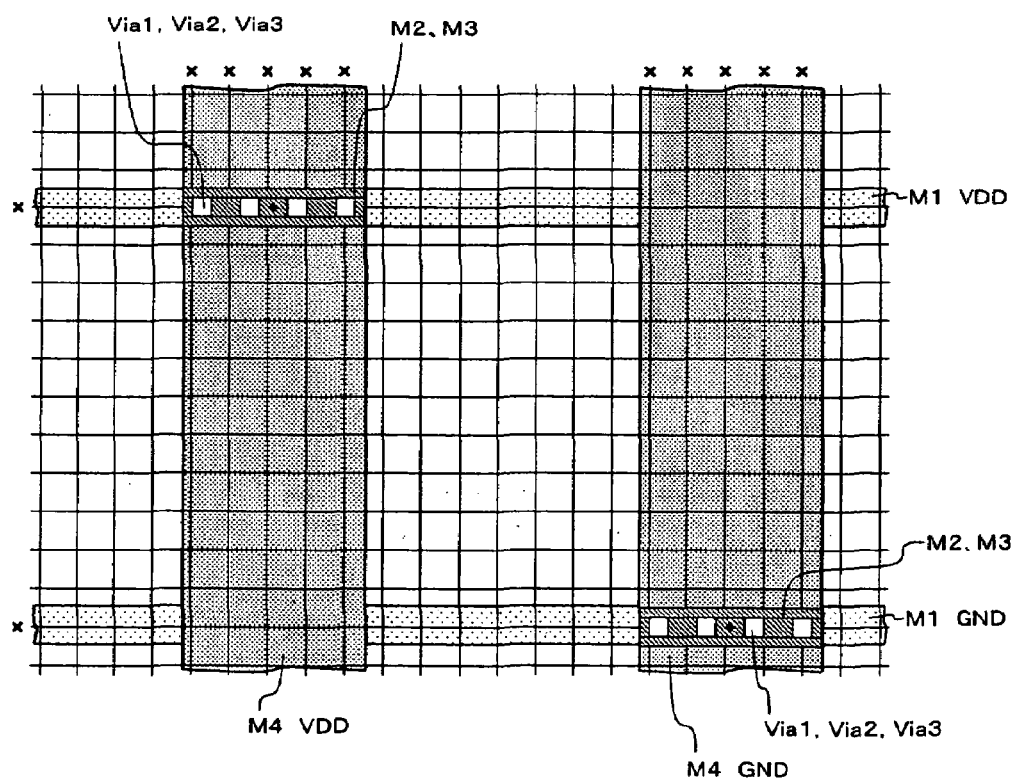
FIG. 15 is a partial plan view schematically illustrating structure in a case where the wiring width of M4 has been made greater than the width of a 4-column, 1-row via unit according to the conventional power wiring process.
Figure 16:
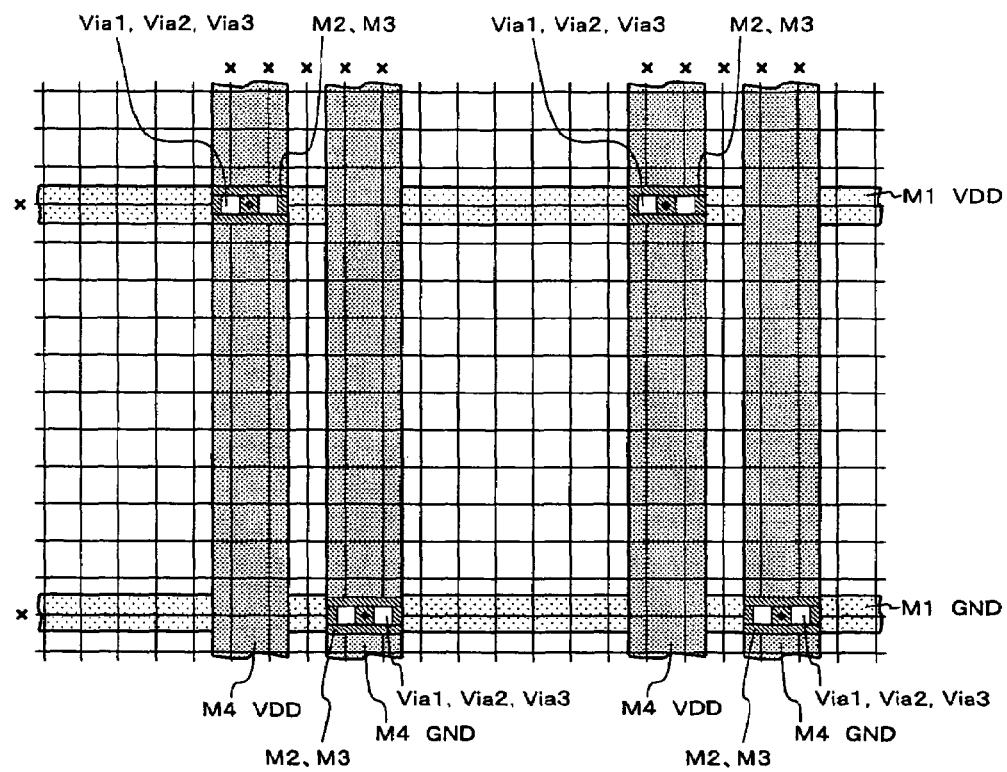
FIG. 16 is a partial plan view schematically illustrating structure in a case where two sets of a pair of power wiring traces pertaining to M4 have been generated and four 2-column, 1-row via units have been generated according to the conventional power wiring process.
Figure 17:
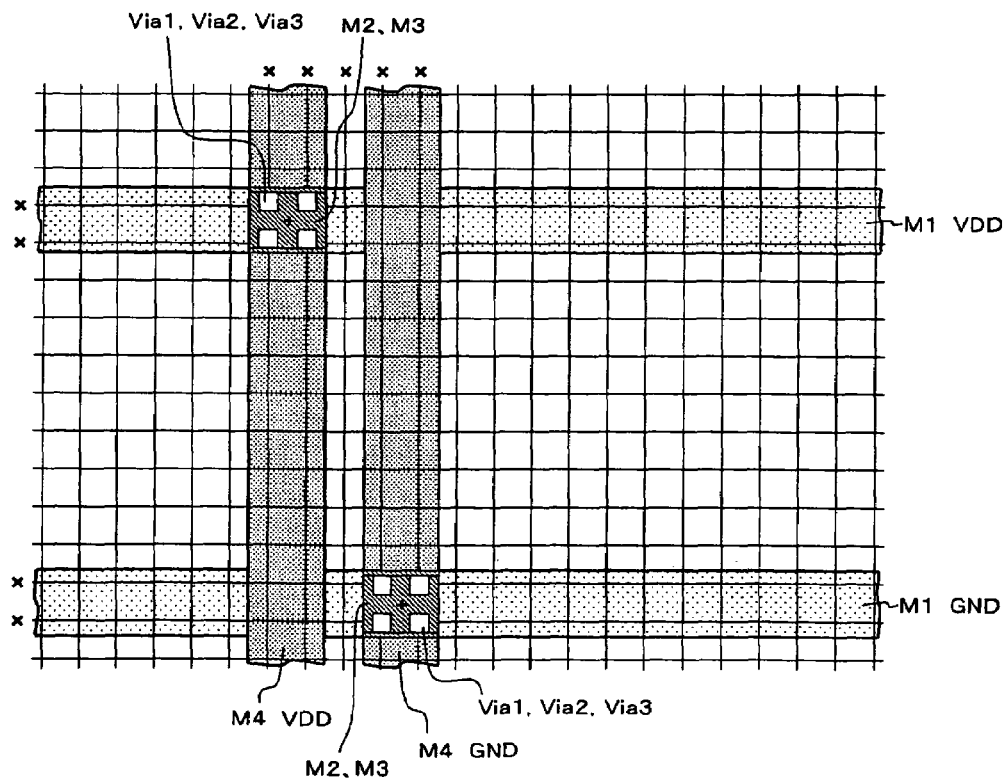
FIG. 17 is a partial plan view schematically illustrating structure in a case where the wiring width of M1 has been enlarged and a 2-column, 2-row via unit generated according to the conventional power wiring process.

A sixth embodiment of the present invention will now be described with reference to the drawings. FIG. 11 is a flowchart illustrating a method of laying out the structure of wiring of a semiconductor integrated circuit according to a sixth embodiment of the present invention. The layout method according to the sixth embodiment is such that the following steps are executed automatically by running a layout program using a layout apparatus (CAD apparatus) that designs the semiconductor integrated circuit.

First, the apparatus executes power wiring preprocessing (e.g., chip-level layout processing) (step A1). Next, the uppermost wiring traces (e.g., M4) comprising the single pair of power wiring traces of different potentials (VDD, GND) are generated at a prescribed wiring width (e.g., wiring widths A and B are adopted for VDD and GND, respectively, of M4) in parallel with the minimum wiring spacing (the minimum spacing that enables the wiring tracks to be made effective) between them (steps A2 and A3). Next, wiring traces (e.g., M1) in the lowermost wiring layer comprising the single pair of power wiring traces of different potentials (VDD, GND) are generated at a prescribed wiring width (e.g., a wiring width a is adopted for both VDD and GND of M1) in parallel with a prescribed wiring spacing between them in such a manner they will be rendered in a direction perpendicular to the wiring (e.g., M4) in the uppermost wiring layer as seen from the direction normal to the plane (steps A4 and A5). Next, the intersecting portions and wiring widths of M1 to M4 are extracted and via wiring processing is executed based upon the extracted information relating to intersecting portions and wiring width (step A6). This is followed by executing power wiring post-processing (e.g., power via check processing and chip-level wiring processing) (step A7).

In the via wiring processing, information relating to wiring patterns corresponding to the extracted information pertaining to intersecting portions and wiring width is read out of via wiring data, which has been stored in the layout apparatus, and the processing set forth below is executed. It should be noted that the via wiring data is data that stipulates the vias (Vias 1, Vias 2, Vias 3) and layout patterns of the intermediate wiring layers (M2, M3) (e.g., the layout patterns of the kind illustrated in the first to fifth embodiments) that correspond to the information relating to the intersecting portions (or areas) and wiring widths of M1 to M4.

First, m-number of vias (Vias 3) connected to the uppermost wiring layer (M4) are generated for each of the power wiring traces of different potential (step B1). Here Vias 3 are generated so as to be disposed within a zone of wiring tracks superposed by the lowermost wiring layer (M1) and uppermost wiring layer (M4) and so as to fit within a rectangular shape of n columns and k rows (where n, k are integers equal to or greater than 1 and n×k≧m holds) and in such a manner that the center of a via unit comprising the vias (Vias 3) is disposed at an intersecting portion of the lowermost wiring layer (M1) and uppermost wiring layer (M4).

Next, m-number of vias (Vias 1, Vias 2) connected to the wiring layers (M1, M2, M3) are generated between wiring layers (M1, M2, M3) other than the uppermost wiring layer (M4) for each of the power wiring traces of different potential (step B2). Here Vias 1, Vias 2 are generated so as to be disposed within a zone of wiring tracks superposed by the lowermost wiring layer (M1) and uppermost wiring layer (M4) and so as to fit within a rectangular shape of j columns and h rows (where j, h are integers equal to or greater than 1 and j×h≧m holds) and in such a manner that the center of a via unit, as seen from the direction normal to the plane, comprising the vias (Vias 1, Vias 2) other than the vias connected to the uppermost wiring layer (M4) will be offset by a prescribed amount from the center, as seen from the direction normal to the plane, of a via unit comprising vias (Vias 3) connected to the uppermost wiring layer (M4).

Next, the intermediate wiring layer (M3) immediately underlying the uppermost wiring layer (M4) is generated for each of the power wiring traces of different potential (step B3). Here the layer M3 is generated so as to be disposed, as seen from the direction normal to the plane, within a zone of wiring tracks superposed by the lowermost wiring layer (M1) and uppermost wiring layer (M4) in an area that includes the intersecting portion between the lowermost wiring layer (M1) and uppermost wiring layer (M4) in such a manner that it will be connected to the vias (Vias 2, Vias 3) pertaining to the corresponding potentials.

Next, the intermediate wiring layer (M2), which is other than the layer immediately underlying the uppermost wiring layer (M4), is generated for each of the power wiring traces of different potential (step B4). Here the layer M2 is generated so as to be disposed, as seen from the direction normal to the plane, within a zone of wiring tracks superposed by the lowermost wiring layer (M1) and uppermost wiring layer (M4) in the vicinity of the intersecting portion between the lowermost wiring layer (M1) and uppermost wiring layer (M4) in such a manner that it will be connected to the vias (Vias 1, Vias 2) pertaining to the corresponding potentials. It should be noted that the order of the steps B1 to B4 may be changed if desired.

In accordance with the sixth embodiment, it is possible to automatically generate the wiring structure of a semiconductor integrated circuit in which expenditure of effective wiring resources can be minimized without detracting from the EMI resistance of power wiring.

In a further embodiment, there is provided a layout program for causing a layout apparatus to execute:

a step of generating a first wiring layer in which one pair of wiring traces of first and second potentials that differ from each other are disposed in parallel with a prescribed spacing between them, and a second wiring layer disposed in a layer different from the first wiring layer and in which one pair of wiring traces of the first and second potentials are disposed in parallel with a minimum spacing between them that can render wiring tracks effective and are in a direction perpendicular to the wiring traces of the first wiring layer;

a step of extracting intersecting portions between the second wiring layer and the first wiring layer as well as wiring widths; and on the basis of information relating to the extracted intersecting portions and wiring widths, a step of generating one or a plurality of intermediate wiring layers disposed between the first wiring layer and the second wiring layer and, as seen from the direction normal to the plane, disposed in a zone of wiring tracks superposed by wiring of the first wiring layer and wiring of the second wiring layer, m-number (where m is an integer equal to or greater than 1) of first vias connecting the wiring of the intermediate wiring layer and the wiring of the first wiring layer, and m-number (where m is an integer equal to or greater than 1) of second vias connecting the wiring of the intermediate wiring layer and the wiring of the second wiring layer;

wherein said step of generating the second vias causes the layout apparatus to generate the second vias so as to dispose said second vias within a zone of wiring tracks superposed by wiring traces of the second wiring layer and of the first wiring layer as seen from the direction normal to the plane and so as to fit said second vias within a rectangular shape of n columns and k rows (where n, k are integers equal to or greater than 1 and n×k≧m holds) and in such a manner that the center of a via unit, which comprises the second vias, as seen from the direction normal to the plane is disposed at an intersecting portion of the first wiring layer and second wiring layer as seen from the direction normal to the plane; and said step of causes the layout apparatus to generate the first vias so as to dispose said first vias within a zone of wiring tracks superposed by wiring traces of the second wiring layer and of the first wiring layer as seen from the direction normal to the plane and so as to fit said first vias within a rectangular shape of j columns and h rows (where j, h are integers equal to or greater than 1 and j×h≧m holds) and in such a manner that the center of a via unit for the first potential, as seen from the direction normal to the plane, of via units comprising the first vias is offset by a prescribed amount from the center of the via unit for the first potential, as seen from the direction normal to the plane, toward the side of the wiring of the second potential in the second wiring layer.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor integrated circuit comprising:
a first wiring layer having one pair of wiring traces of first and second potentials that differ from each other;
a second wiring layer disposed in a layer different from said first wiring layer and having one pair of wiring traces of the first and second potentials; and
one or a plurality of intermediate wiring layers disposed between said first wiring layer and said second wiring layer,
wherein the pair of wiring traces of said first wiring layer are disposed in parallel with a prescribed spacing between them,
wherein the pair of wiring traces of said second wiring layer are disposed in parallel with a minimum spacing between them for rendering wiring tracks effective,
wherein the wiring traces of said first wiring layer are in a direction perpendicular to the wiring traces of said second wiring layer,
wherein same-potential wiring traces of said first wiring layer and of said second wiring layer are electrically connected through said intermediate wiring layer and vias,
wherein, as seen from a direction normal to the plane, said intermediate wiring layer is disposed within a zone of wiring tracks superposed by wiring of said first wiring layer and wiring of said second wiring layer,
wherein a number of first vias that connect the wiring of said intermediate wiring layer and the wiring of said first wiring layer is m where m is an integer equal to or greater than 1,
wherein a number of second vias that connect the wiring of said intermediate wiring layer and the wiring of said second wiring layer is m where m is an integer equal to or greater than 1,
wherein the first vias are disposed within a zone of wiring tracks superposed by wiring traces of said second wiring layer and of said first wiring layer as seen from the direction normal to the plane and fit within a rectangular shape of j columns and h rows where j, h are integers equal to or greater than 1 and j×h≧m,
wherein the second vias are disposed within a zone of wiring tracks superposed by wiring traces of said second wiring layer and of said first wiring layer as seen from the direction normal to the plane and fit within a rectangular shape of n columns and k rows where n, k are integers equal to or greater than 1 and n×k≧m,
wherein the first vias are disposed within an area in which same-potential wiring traces of the wiring of said intermediate wiring layer and the wiring of said first wiring layer overlap,
wherein the second vias are disposed within an area in which same-potential wiring traces of the wiring of said second wiring layer and of the wiring of said first wiring layer overlap,
wherein a center of a via unit for the first potential of via units comprising the second vias, as seen from the direction normal to the plane, is disposed at an intersecting portion of said first wiring layer and said second wiring layer,
wherein a via unit for the first potential of via units comprising the first vias is disposed at a position where it is superimposed at least partially upon the via unit for the first potential of via units comprising the second vias, as seen from the direction normal to the plane, and
wherein a center of the via unit for the first potential of via units comprising the first vias, as seen from the direction normal to the plane, is offset by a prescribed amount from the center of the via unit for the first potential of via units comprising the second vias, as seen from the direction normal to the plane, toward a side of wiring of the second potential in said second wiring layer.

2. The semiconductor integrated circuit according to claim 1, wherein first vias connected to wiring on a side of the first potential and first vias connected to the wiring on the side of the second potential are disposed on same axes, a direction of which is that of wiring of said second wiring layer.

3. The semiconductor integrated circuit according to claim 1, wherein said intermediate wiring layer is disposed such that said intermediate wiring layer overlaps one or both of the pair of wiring traces of said second wiring layer.

4. The semiconductor integrated circuit according to claim 1, wherein said intermediate wiring layer comprises two or more layers,
  wherein said intermediate wiring layers are connected by third vias,
  wherein the third vias are disposed at positions at which they overlap the first vias as seen from the direction normal to the plane, and
  wherein wiring length of whichever of said intermediate wiring layers that immediately underlies said second wiring layer is equal to or greater than a wiring length of whichever of said intermediate wiring layers are other than the intermediate wiring layer that immediately underlies said second wiring layer.

5. The semiconductor integrated circuit according to claim 1, wherein said intermediate wiring layer comprises two or more layers,
  wherein said intermediate wiring layers are connected by third vias,
  wherein the third vias are disposed at positions at which they overlap the first vias as seen from the direction normal to the plane, and
  wherein a wiring width of whichever of said intermediate wiring layers that immediately underlies said second wiring layer is equal to or greater than a wiring width of whichever of said intermediate wiring layers are other than the intermediate wiring layer that immediately underlies said second wiring layer.

6. The semiconductor integrated circuit according to claim 1, wherein said intermediate wiring layer that immediately underlies said second wiring layer is formed in one of a rectangular shape, a T-shaped configuration, and an L-shaped configuration as seen from the direction normal to the plane.

7. The semiconductor integrated circuit according to claim 1, wherein the number of vias that connect the wiring of the first wiring layer and the second wiring layer is an integer equal to or greater than 4,
  wherein the vias other than the vias connected to an uppermost wiring layer have been offset to a side of a pair of wiring traces of said uppermost wiring layer by a prescribed amount and are disposed within a zone of wiring tracks superposed by the uppermost wiring layer and a lowermost wiring layer, and
  wherein the intermediate wiring layers other than the intermediate wiring layer immediately underlying the uppermost wiring layer are disposed to overlap one or both of the pair of wiring traces of the uppermost wiring layer.

8. A semiconductor integrated circuit, comprising:
  an upper and a lower wiring layer, said upper and lower wiring layers comprising a first potential and a second potential;
  one or a plurality of intermediate wiring layers;
  a set of lower vias of first potential connecting said lower wiring layer to said intermediate wiring layers;
  a set of upper vias of first potential connecting an uppermost intermediate wiring layer to said upper wiring layer, and
  a center of said set of upper vias of said first potential being disposed at an intersecting portion of said upper wiring layer and said lower wiring layer when seen from a direction normal to the plane,
  wherein said set of lower vias of said first potential is disposed at a position where it is superimposed at least partially upon said set of upper vias of said first potential, when seen from the direction normal to the plane, and
  wherein said center of said set of lower vias of said first potential is offset by a prescribed amount from said center of said set of upper vias of first potential toward a side of wiring of said second potential in said upper wiring layer when seen from the direction normal to the plane.

9. The semiconductor integrated circuit according to claim 8, wherein said lower and upper wiring layers include a pair of wiring traces of said first potential and said second potential.

10. The semiconductor integrated circuit according to claim 1, wherein a center of the via unit for a second potential of via units comprising the first vias, as seen from the direction normal to the plane, is offset by a prescribed amount from the center of a via unit for a second potential of via units comprising the second vias, as seen from the direction normal to the plane, toward a side of wiring of the first potential in said second wiring layer.

11. The semiconductor integrated circuit according to claim 1, wherein said first and second wiring layers and said intermediate wiring layers are disposed with a prescribed spacing between them in a direction in which the layers are stacked.

* * * * *